(12) United States Patent
Yano et al.

(10) Patent No.: US 7,372,743 B2
(45) Date of Patent: May 13, 2008

(54) CONTROLLING A NONVOLATILE STORAGE DEVICE

(75) Inventors: Masaru Yano, Tokyo (JP); Hideki Arakawa, Kanagawa (JP); Mototada Sakashita, Tokyo (JP); Akira Ogawa, Tokyo (JP); Yoshiaki Shinmura, Tokyo (JP); Hajime Aoki, Tokyo (JP)

(73) Assignee: Spansion, LLC, Sunnyvale, CA (US)

( * ) Notice: Subject to any disclaimer, the term of this patent is extended or adjusted under 35 U.S.C. 154(b) by 0 days.

(21) Appl. No.: 11/639,128

(22) Filed: Dec. 13, 2006

(65) Prior Publication Data
US 2007/0183193 A1    Aug. 9, 2007

Related U.S. Application Data

(63) Continuation-in-part of application No. PCT/JP2005/023011, filed on Dec. 15, 2005.

(51) Int. Cl.
*G11C 16/04* (2006.01)
(52) U.S. Cl. .................... 365/185.33; 365/185.02; 365/210
(58) Field of Classification Search ........... 365/185.02, 365/185.24, 185.33, 210
See application file for complete search history.

(56) References Cited

U.S. PATENT DOCUMENTS 6,822,909 B1 * 11/2004 Hamilton et al. ...... 365/185.28

2003/0218205 A1 * 11/2003 Takamura .................. 257/315

FOREIGN PATENT DOCUMENTS

| JP | 2003257188 | 9/2003 |
|---|---|---|
| JP | 2004515024 | 5/2004 |
| JP | 2004529448 | 9/2004 |
| JP | 2005522817 | 7/2005 |
| JP | 2004079602 | 12/2006 |

* cited by examiner

*Primary Examiner*—Thong Q. Le

(57) ABSTRACT

A control method for a nonvolatile storage device having a storage mode in which in a memory cell provided with a trapping dielectric layer 1-bit data is stored depending on the presence or absence of charge in a first trapping region. In a dynamic reference cell initialization operation, a charge accumulation operation is performed, as a preset operation in the initialization operation, on second trapping regions of first and second dynamic reference cells to a charge accumulation operation on a second trapping region of the memory cell. In addition, at the time of data rewrite, preprogram verification and preprogramming are performed on the first trapping regions. This makes it possible to shorten the time taken for initialization and data rewrite.

27 Claims, 14 Drawing Sheets

FIG. 8

CONTROLLING A NONVOLATILE STORAGE DEVICE

CROSS-REFERENCES TO RELATED APPLICATIONS

This is a continuation in part of International Application No. PCT/JP2005/023011, filed Dec. 15, 2005 which was not published in English under PCT Article 21(2).

TECHNICAL FIELD

The present invention relates generally to a control method of controlling a nonvolatile storage device which includes a dynamic reference cell for data read-out from a memory cell provided with a trapping dielectric layer. This invention relates more particularly to the technology of shortening the time required for dynamic reference cell initialization and data rewrite operations which are conducted prior to reading out data.

BACKGROUND ART

Japanese Unexamined Patent Publication No. 2004-79602 discloses a nonvolatile memory cell which is configured such that it has, between a control gate and a semiconductor substrate, a nitride film as a charge trap layer which is sandwiched between two oxide films. Electric charge is trapped in the trap layer to thereby cause the cell transistor threshold to vary, and data "0" and data "1" are stored. Since the trap layer is a dielectric layer, the trapped charges are not allowed to migrate within the trap layer. One bit is stored in a first region of the nitride film in close proximity to a first source/drain region which is one of a pair of source/drain regions, and the other bit is stored in a second region of the nitride film in close proximity to a second source/drain region which is the other of the pair of source/drain regions. To sum up, 2-bit information can be stored in the nonvolatile memory cell.

In addition, in some usage cases, only 1-bit information is stored in a nonvolatile memory cell. To this end, the second region of the nitride film is used as a nonuse bit region and is placed in a charge trap state, with data to the nonvolatile memory cell retained, while the first region of the nitride film is used as a use bit region and data is stored depending on the presence or absence of charge in the first region.

The above nonvolatile memory cell is characterized in that, by trapping charge in the nonuse bit region, the time taken to trap (program) charge in the use bit region is shortened, and the retention characteristic of charge trapped in the use bit region, is improved.

On the other hand, Japanese Unexamined Patent Publication No. 2004-110881 discloses a technique in which, in order that the characteristic of a reference cell at the time of reading out data may match the characteristic of a nonvolatile memory cell where the data is stored, the reference cell is arranged in the layout region of the nonvolatile memory cell. The purpose of this is to cause the reference cell to undergo the same history as the history of the bias that is applied to the nonvolatile memory cell, whereby both the cells have the same cell characteristic.

In this case, the characteristic of reference cells may vary due to the variation taking place during fabrication process, the layout position in the nonvolatile memory cell layout region, and so on. In addition, it is also conceivable that the data read-out margin varies depending on, for example, the layout position relationship between a nonvolatile memory cell which is a read-out target and a reference cell. To cope with this, two dynamic reference cells are provided, and DATA "0" is written to one of the two dynamic reference cells, while DATA "1" is written to the other dynamic reference cell. Output currents from the two dynamic reference cells are merged, whereby the read-out margin is secured.

FIG. 13 illustrates by way of example a configuration of each dynamic reference cell having a charge accumulation layer formed by a trap layer, e.g. a nitride film et cetera. Nonvolatile memory cells (16 cells) which are not shown are connected to a common word line. The eight cells on the right hand side together form a block, while the eight cells on the left hand side together form another block. In each block, the nitride film's first and second regions of the nonvolatile memory cells (8 cells) are identified by ADDRESSES (from 8 to f) and by ADDRESSES (from 0 to 7), respectively. With reference to FIG. 13, nitride film's first regions in the blocks that are identified by one of ADDRESSES (from 8 to f) are selected at the same time, and a data parallel read-out operation is performed depending on the presence or absence of charge.

The dynamic reference cell (DRB, DRA) has the same device configuration as the nonvolatile memory cell, and is composed of sixteen cells which are connected to a common word line. In response to addressing to the nonvolatile memory cells, the first regions of the nitride film are identified by ADDRESSES (from 8 to f), while on the other hand the second regions of the nitride film are identified by ADDRESSES (from 0 to 7). The eight cells on the right hand side are a first dynamic reference cell DRB where DATA "01" is stored and the second eight cells on the left hand side are a second dynamic reference cell DRA where DATA "10" is stored.

Here, the notation of DATA "10" and DATA "01" is described. Of the two numeric values arranged side by side, the prefix numeric value is indicative of the presence or absence of charge in the nitride film's first regions of ADDRESSES (from 8 to f) and the postfix numeric value is indicative of the presence or absence of charge in the nitride film's second regions of ADDRESSES (from 0 to 7). The numeric value "1" is indicative of the absence of charge while on the other hand the numeric value "0" is indicative of the injection of charge. DATA "01" which is stored in the first dynamic reference cell DRB is indicative of the state in which charge has been injected to the nitride film's first regions, while no charge exists in the nitride film's second regions, and LOGIC VALUE "0" is stored. On the other hand, DATA "10" which is stored in the second dynamic reference cell DRA is indicative of the state in which no charge exists in the nitride film's first regions, while charge has been injected to the nitride film's second regions, and LOGIC VALUE "1" is stored.

If the nonvolatile memory disclosed in Japanese Unexamined Patent Publication No. 2004-79602 is used in a NAND interface, both the first and second regions of the nitride film of the nonvolatile memory cell must be subjected to an erase operation prior to performing a data program operation.

Generally, a plural number of nonvolatile memory cells are collectively data-erased. In this case, a bias for collective data erase is applied to a memory cell array which is a layout region for the nonvolatile memory cells, so that at the same time the bias is applied also to the dynamic reference cells DRB, DRA arranged in the memory cell array. With reference to FIG. 13, both the nonvolatile memory cells (16 cells) and the dynamic reference cells DRB, DRA (16 cells) are fed an erase operation bias, and they are erased. Such an erase operation places every nonvolatile memory cell and every dynamic reference cell in STATE "11" in which, in the nitride film, neither the first region nor the second region enters the no charged state.

If a nonvolatile memory cell is used as a 1-bit storage cell, charge is preinjected to a nitride film's second region. This operation is called a "preset operation" and is carried out by a program operation to the nitride film's second region. This places every nonvolatile memory cell in STATE "10" in which, in the nitride film, the first region is not charged, but the second region enters the charge injected state.

The above sequence allows the nonvolatile memory cells to enter the programmable state. On the other hand, at this point in time, the dynamic memory cells are held at STATE "11". Consequently, during the program operation period prior to starting a read-out operation, it becomes necessary to program each dynamic memory cell. With respect to the dynamic reference cell DRA, the second regions of the nitride film corresponding to ADDRESSES (from 0 to 7) are subjected to a program operation so that the dynamic reference cell DRA is placed in DATA "10" STATE. On the other hand, with respect to the dynamic reference cell DRB, the first regions of the nitride film corresponding to ADDRESSES (from 8 to f) are subjected to a program operation so that the dynamic reference cell DRB is placed in DATA "01" STATE. In some memories having a NAND interface, memory cells are programmed while sequentially generating a plural number of addresses within the device in a single program operation. In this case, ADDRESSES (from 8 to f), which are correspond to nitride film's first regions of the nonvolatile memory cells, sequentially vary. A nonvolatile memory cell that is a program target is subjected to a program operation, while simultaneously charge is injected to the first region of each nitride film of the dynamic reference cell DRB. In addition, ADDRESSES (from 0 to 7) sequentially vary, and charge is injected to the second region of each nitride film of the dynamic reference cell DRA. As a result of this, during the program operation period, data programming to the nonvolatile memory cells is carried out and, in addition, the dynamic reference cells DRB, DRA are preset to DATA "01" and to DATA "10", respectively.

BRIEF DESCRIPTION OF THE DRAWINGS

FIG. 8 is a diagram which illustrates a case in which, with respect to the first and second dynamic reference cells arranged in the memory cell array, their charge accumulation state is in a checkerboard pattern;

DETAILED DESCRIPTION OF THE INVENTION

Problems Identified in the Prior Art

Figure 1:
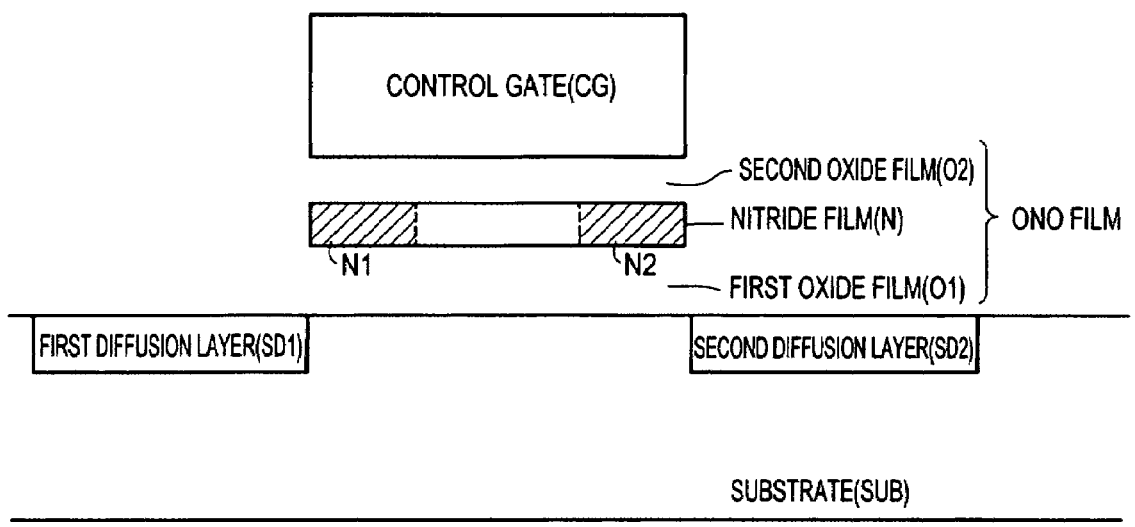
FIG. 1 is a diagram which illustrates a cross sectional structure of a memory cell which is provided with a trapping dielectric layer.

If a nonvolatile memory cell is used as a 1-bit storage cell in a nonvolatile memory described in the above background art, addresses for identifying the dynamic reference cells include ADDRESSES (from 0 to f), although real data storage regions are ADDRESSES (from 8 to f). A dynamic reference cell initialization operation is carried out simultaneously with a nonvolatile memory cell program operation; however, the dynamic reference cell that is identified by ADDRESSES (from 0 to f) has an address region twice as large as that of the real data storage region that is identified by ADDRESSES (from 8 to f). This raises the problem that the time taken to initialize a dynamic reference cell should be secured, such that it exceeds the time required for programming real data to a nonvolatile memory cell.

Besides, an erase operation is executed at the time of data rewrite. However, with respect to all the nonvolatile memory cells, charge is once injected to their nitride film's first and second regions prior to applying an erase operation bias. In other words, all the nitride film's first and second regions are placed in the program state. This is a so-called pre-program operation. The purpose of this is to prevent each nitride film region from entering an over erase state due to the erase bias application.

Since, in the pre-program state, a bias is applied individually to the nitride film regions in the erase state (no charge exists), a pre-program verify operation is executed prior to the bias application. The existence of electrical charge is inspected at each nitride film region.

This pre-program verify operation is performed on each of the first and second regions of the nitride film of the nonvolatile memory cell, the reason for which is that there are cases where 2-bit information is stored per cell. However, for the case where 1-bit information is stored per cell, that the second region of the nitride film is in the charge injected state is known. Because of the pre-program verify operation, a verification operation is performed even on the second region that does not originally require verification at all. This produces the problem of taking time more than necessary for the pre-program verify operation at the time of data rewrite.

Overview

The present invention was made with a view to providing solutions to the problems with the aforesaid background art. Accordingly, an object of the present invention is to provide a nonvolatile storage device control method capable of shortening the operating time either by contriving dynamic reference cell initialization in a program operation prior to a data read-out operation or by optimizing a pre-program operation at the time of data rewrite.

In order to achieve the above object, according to the first aspect of the present invention, there is provided, in a nonvolatile storage device comprising a memory cell including first and second diffusion layers and an insulating trapping layer located close to the first and second diffusion layers and having first and second trapping regions for trapping charges therein, a first dynamic reference cell having an equivalent structure to the memory cell wherein the first trapping region of the first dynamic reference cell is set in a charge accumulated state, and a second dynamic reference cell having an equivalent structure to the memory cell wherein the first trapping region of the second dynamic reference cell is set in a charge depleted state, a method for initializing the first and second dynamic reference cells when a data storage operation stores one-bit data in accordance with the presence or absence of charges in the first trapping region of the memory cell, the method comprises the steps of:

presetting the second trapping regions of the memory cell, first and second dynamic reference cells into the charge accumulated state; and setting the first trapping region of the first dynamic reference cell into the charge accumulated state in accordance with the data storage operation of the memory cell after the presetting step.

In a method of controlling a nonvolatile storage device in accordance with the first concept of the present invention formed in accordance with the first concept of the present invention, (a) a memory cell which includes a trapping dielectric layer and in which in the trapping dielectric layer charges are trapped in first and second trapping regions of the trapping dielectric layer, the first and second trapping regions being located in close proximity to first and second diffusion layers, respectively, and (b) first and second dynamic reference cells are provided. The first and second dynamic reference cells serve as reference cells at the time of read-out, with their first trapping regions placed in the charge accumulation state and in the charge depletion state, respectively. When 1-bit data is stored depending on the presence or absence of charge in the first trap region of the memory cell, the initialization operation of the first and second dynamic reference cells prior to the read-out operation is performed as follows. That is, as a preset operation, the second trapping region of the memory cell and the second trapping regions of the first and second dynamic reference cells are preset to the charge accumulation state. Subsequently, as a set operation, the first trapping region of the first dynamic reference cell is set to the charge accumulation state in response to an operation of storing data to the memory cell.

Consequently, in regard to the first dynamic reference cell, its first and second trapping regions are both placed in the charge accumulation state. On the other hand, in regard to the second dynamic reference cell, the first trapping region is in the charge depletion state and the second trapping region is placed in the charge accumulation state.

Here, for example, the charge accumulation operation is a program operation, and the charge accumulation state is a program state in which bit data "0" is stored. On the other hand, the charge depletion operation is an erase operation, and the charge depletion state is an erase state in which bit data "1" is stored. In the memory cell and the first and second dynamic reference cells each having two regions (i.e. the first and second trapping regions), the charge state of the first trapping region and the charge state of the second trapping region are represented, in that order, by two bit data values arranged side by side. When the set operation is complete, the first dynamic reference cell enters the charge state "00", and bit data "0" is stored. On the other hand, the second dynamic reference cell enters the charge state "10", and bit data "1" is stored.

In the background art, the first dynamic reference cell is set to the charge state "01" and the second dynamic reference cell is set to the charge state "10", whereby bit data "0" and bit data "1" are stored. In this case, it is necessary to perform an erase operation on each of the first and second trapping regions so that the charge state becomes "11" and then perform a program operation on the first trapping region of the first dynamic reference cell as well as on the second trapping region of the second dynamic reference cell. On the other hand, in the present invention, it is possible to perform a preset operation concurrently with a set operation to the charge accumulation state of the second trapping region of the memory cell. Consequently, the first and second dynamic reference cells are placed in the charge state "10" prior to the set operation. Therefore, in the set operation, it suffices if a program operation is performed on the first trapping region of the first dynamic reference cell in response to the storing of data to the memory cell.

In the set operation, there is no need to program the first trapping region of the second dynamic reference cell, thereby making it possible to shorten the time needed for the set operation.

In addition, in the background art, when programming either one of the first and second trapping regions that are trapping regions situated face to face with each other, the charge state of the second or first trapping region is at "1". On the other hand, in the set operation in the present invention, when programming the first trapping region of the first dynamic reference cell, the second trapping region is at "0". It is well known that, when performing a program operation on one trapping region in a memory cell provided with a trapping dielectric layer, the amount of threshold voltage shift by an applied bias in the program operation is great if the charge state of the other opposing trapping region is at "0", in comparison with at "1". That is, the program time is shortened. Therefore, when compared to the background art in which the charge state of the second trapping region is at "1", in the present invention in which the charge state of the second trapping region is at "0", the individual program time for the first trapping region of the first dynamic reference cell can be shortened.

The number of dynamic reference cells that require a program operation is reduced to half and, in addition, it becomes possible to shorten the individual program time. As a result, the time needed for the initialization operation of the first and second dynamic reference cells can be shortened.

According to the second aspect of the present invention, there is provided, in a nonvolatile storage device comprising a memory cell including first and second diffusion layers and an insulating trapping layer that is located close to the first and second diffusion layers and has first and second trapping regions for trapping charges therein, a method comprising the steps of:

prior to a data rewriting operation in the case where one-bit data is stored according to the presence or absence of charges in the first trapping region, checking a trapping state of charges with respect to the first trapping region of the memory cell;

performing a charge accumulating operation when it is confirmed that the first trapping region is in a charge depleted state; and setting the first trapping regions of all the memory cells into the charge accumulated state and then performing a charge depleting operation with respect to the first and second trapping regions.

In a method of controlling a nonvolatile storage device in accordance with the second concept of the present invention formed in accordance with the second concept of the present invention, a memory cell, which includes a trapping dielectric layer and in which in the trapping dielectric layer charges are trapped in first and second trapping regions of the trapping dielectric layer that are located in close proximity to first and second diffusion layers, respectively, is provided. When storing 1-bit data depending on the presence or absence of charge in the first trapping region of the memory cell, prior to a data rewrite operation, a charge trap state verifying operation is performed only on the first trapping region of the memory cell. If the first trapping region of the memory cell is verified to be in the charge depletion state, a charge accumulation operation is then performed. After the first region of each memory cell is placed in the charge accumulation state, a charge depletion operation is performed on the first and second trapping regions.

Here, for example, the charge accumulation operation is a program operation, and the charge accumulation state is a program state. In addition, the charge depletion operation is an erase operation, and the charge depletion state is an erase state. In the nonvolatile storage device, there are some cases requiring that, at the time of data rewrite, data stored in a memory cell is erased and new data is then written to the memory cell. In this case, prior to the data erase operation, all the memory cells have to be once placed in the program state. This is a so-called pre-program operation. The reason for this is that bias is collectively applied to a plural number of memory cells in the erase operation.

In accordance with the second concept of the present invention, the second trapping region in which no bit data is stored is maintained in the program state, and it is the first trapping region in which bit data is stored and which is placed either in the program state or in the erase state. Prior to an erase operation on every memory cell which is conducted at the time of data rewrite, neither a charge state detection operation nor a pre-program operation for the case of an erase state is not performed on the second trapping region, but these operations are performed only on the first trapping region. This makes it possible to shorten the time taken to complete the erase operation.

In accordance with the present invention, it becomes possible to shorten the operating time by optimizing a charge accumulation operation that is performed on an individual cell, in the initialization operation of the first and second dynamic reference cells and in the rewrite operation of data stored in the memory cell.

DESCRIPTION OF EXAMPLE EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

In a memory cell of FIG. 1, a first oxide film O1, a nitride film N, and a second oxide film O2 are stacked between a channel region sandwiched between first and second diffusion layers SD1, SD2 in the interface of a substrate SUB, and a control gate CG. This is a so-called ONO (oxide-nitride-oxide) film. The nitride film N forms a trapping dielectric layer. Charges injected into the nitride film N are not allowed to move therein, in other words they are trapped within the nitride film N. Charge injection is effected by applying a high voltage either to the first diffusion layer SD1 or to the second diffusion layer SD2 depending on the bias condition selection. In the nitride film N, charge is trapped by a first trapping region N1 which is a region located adjacent to the first diffusion region SD1 or by a second trapping region N2 which is a region located adjacent to the second diffusion region SD2.

As a result of the above, at the time of read-out, by connecting either one of the first and second diffusion layers (SD1, SD2), whichever is located nearer to a bit to be read out, to a source terminal and by connecting the other diffusion layer to a drain terminal, it becomes possible to identify the presence or absence of charge in the bit to be read out. In the following description, "Xtreme MODE" is described. This is an example of a first storage mode. By the switching of the first and second diffusion layers SD1, SD2 to a diffusion layer that serves as a source terminal, it becomes possible to store 1-bit data in each of the first and second trapping regions N1, N2. That is, 2-bit data is stored per memory cell. In the following description, this is called "NORMAL MODE". This is an example of a second storage mode.

Here, in Xtreme MODE, the second trapping region is constantly placed in the program state. This state is called an "Xtreme preset state" in some cases. The purpose of this is that if the second trapping region is placed in the program state, charge injection is efficiently carried out in a program operation on the first trapping region. Thus, the program time is shortened.

Figure 2:
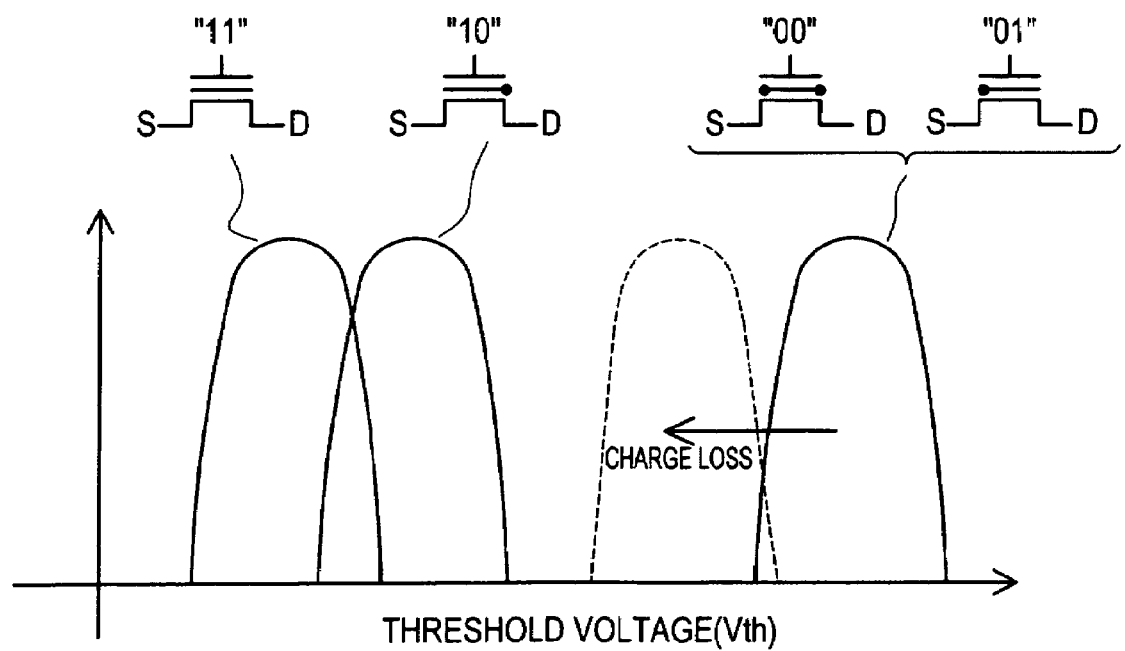
FIG. 2 is a diagram which represents the distribution of memory cell threshold voltages depending on the presence or absence of charge in first and second trapping regions of the trapping dielectric layer.

Referring now to FIG. 2, there is shown the distribution of memory cell threshold voltages depending on the presence or absence of charge in the first and second trapping regions, in a memory cell having a structure as shown in FIG. 1. The first and second trapping regions assume two different charge states, namely a charge accumulation state (indicated by black circle mark) and a charge depletion state (without black circle mark), as shown in FIG. 2. In the description of FIG. 2, the first diffusion layer SD1 serves as a diffusion layer which is connected as a source terminal.

If charge is accumulated in the first trapping region N1, there are two states depending on the charge state of the second trapping region N2, i.e. the presence or absence of charge in the second trapping region N2. One of these two states is CHARGE STATE "00" in which both the first trapping region N1 and the second trapping region N2 are in the charge accumulation state. The other of the two states is CHARGE STATE "01" in which the first trapping region N1 is in the charge accumulation state while on the other hand the second trapping region N2 is in the charge depletion state. In this case, regardless of the charge state of the second trapping region N2, both have the same threshold voltage distribution with its center at a threshold voltage of high level. This is a program state. Since it is decided that a program operation is complete if the level of threshold voltage is higher than that of verify voltage, this makes it possible to provide the same threshold voltage distribution in both CHARGE STATE "00" and CHARGE STATE "01", regardless of the presence or absence of charge in the second trapping region N2.

In addition, the threshold voltage distribution in the program state is determined mainly by the charge accumulation state of the first trapping region N1. Consequently, there is the possibility that, with the phenomenon of charge leak from the first trapping region N1, the level of threshold voltage falls with time. This is a so-called charge loss phenomenon.

If no charge is accumulated in the first trapping region N1, there are two states depending on the charge state of the second trapping region N2, i.e. the presence or absence of charge in the second trapping region N2. One of these two states is CHARGE STATE "10" in which the first trapping region N1 is in the charge depletion state while on the other hand the second trapping region N2 is in the charge accumulation state. The other of the two states is CHARGE STATE "11" in which both the first trapping region N1 and the second trapping region N2 are in the charge depletion state. In this case, both have respective threshold voltage distributions with their centers at threshold voltages of low level. This is an erase state. However, CHARGE STATE "10" and CHARGE STATE "11" have different distribution central threshold voltages. In comparison with the latter, the former has a higher distribution central threshold voltage. The reason for this is as follows. Since the second trapping region N2 is placed in the charge accumulation state in CHARGE STATE "10", this requires a higher threshold voltage for forming an inversion layer in the channel region, as compared to CHARGE STATE "11" in which the second trapping region N2 is placed in the charge depletion state.

Figure 3:
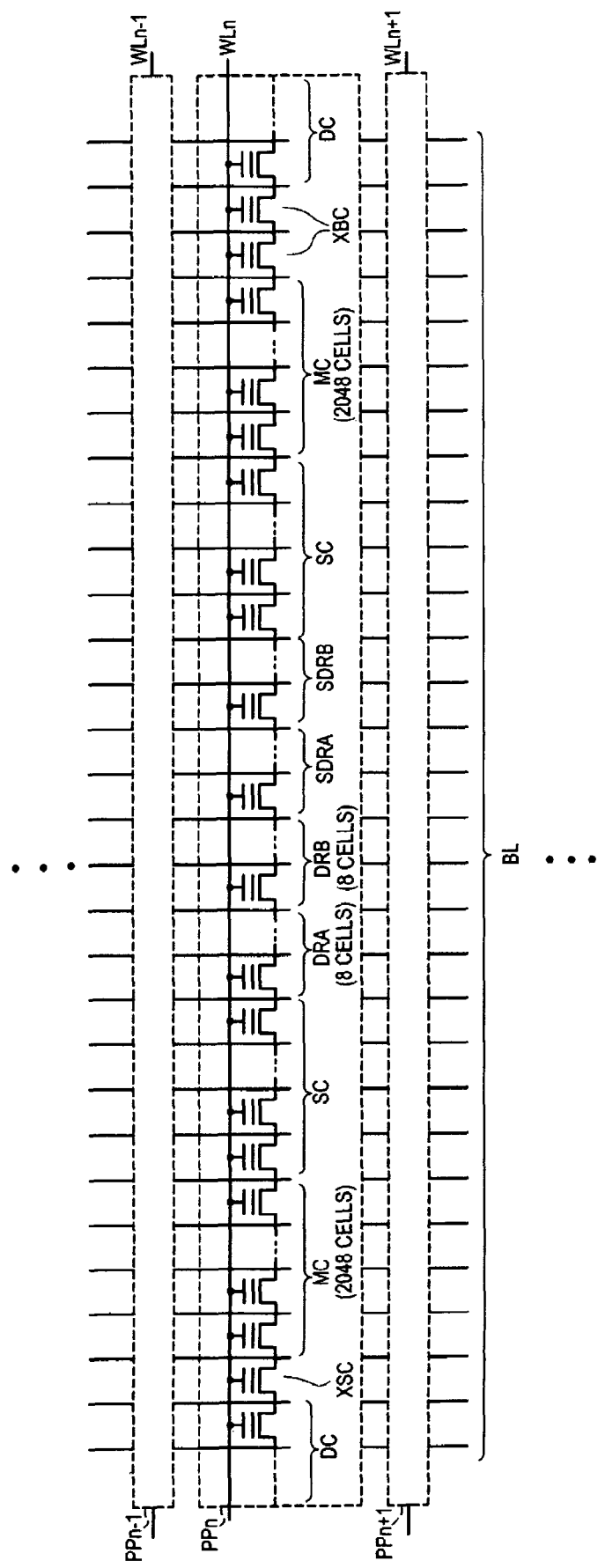
FIG. 3 is a diagram which illustrates by way of example a memory cell connection configuration in a memory cell array.

FIG. 3 is a diagram which illustrates an example of the connection of memory cells. This memory cell connection diagram shows, in regard to the first to third embodiments of the present invention, a configuration within a sector which is an erase operation unit in the nonvolatile storage device. A plural number of word lines ( . . . WLn−1, WLn, WLn+1, . . . ) and a plural number of bit lines BL are provided, wherein memory cells, dynamic reference cells, and the like, are placed at intersection points of the word lines and the bit lines.

If a nonvolatile storage device is formed by a NAND interface, a program operation unit must be composed of for example a single page (2048 bytes). Here, FIG. 3 shows an example in which one bit of data is stored per memory cell in Xtreme MODE. A single page is divided into four partial pages and a single partial page ( . . . PPn−1, PPn, PPn+1, . . . ) is created per word line ( . . . WLn−1, WLn, WLn+1, . . . ).

In the following description, PARTIAL PAGE PPn, on behalf of all of the partial pages, is described. The remaining other partial pages, i.e. ( . . . PPn−1, PPn+1, . . . ), have the same configuration as PARTIAL PAGE PPn. Since a single page is made up of 2048 bytes, PARTIAL PAGE PPn stores therein 4096 bits (2048 bytes×8 bits÷4 partial pages=4096 bits). 4096 memory cells MC are connected to WORD LINE WLn.

With reference to FIG. 3, a dummy cell DC is connected to each end of a word line, the reason for which is that the end region of the memory cell array forming a sector is a region where the device may become unstable in physical characteristic. An Xtreme search cell XSC is placed inside one of the dummy cells DC and an Xtreme blank check cell XBC is placed inside the other of the dummy cells DC. The Xtreme search cell XSC and the Xtreme blank check cell XBC are an example of a mode search cell and an example of a blank check cell, respectively. Arranged inside of each of the Xtreme search cell XSC and Xtreme blank check cell XBC are real cell groups that include memory cells MC (2048 cells), a spare cell SC, and first and second dynamic reference cells DRB, SDRB, DRA, SDRA. 4096 memory cells MC in total are arranged along WORD LINE WLn that forms PARTIAL PAGE PPn. The spare cell SC for storing error check information, file attribute information, and the like is arranged inside the memory cells MC and, in addition, the first and second dynamic reference cells DRA, SDRA, DRB, SDRB are arranged. The first and second dynamic reference cells DRA, DRB are each made up of eight cells and are provided so as to associate with the unit of program to the memory cell MC.

Here, the dynamic reference cells SDRA, SDRB are reference cells that are used for read-out of the spare cells SC. The spare cells SC and the dynamic reference cells SDRA, SDRB for the spare cells SC have the same configuration and provide the same operation/working-effect as the memory cells MC and the dynamic reference cells DRA, DRB, and they are not described here accordingly. In addition, the Xtreme search cell XSC and the Xtreme blank check cell XBC will be described later.

With reference to FIGS. 4-8, the first embodiment is described. The first embodiment is an embodiment that relates to an operation of initializing the first and second dynamic reference cells DRB, DRA in the first storage mode (Xtreme MODE) during which in a memory cell provided with a trapping dielectric layer only the first trapping region is used as a data storage region. In the first embodiment, for the sake of simplification, the description is made taking as an example a memory cell array configuration (see FIGS. 4 and 5) as a part of PARTIAL PAGE PPn (FIG. 3). Two memory cell groups, on which access operations including a program operation, a read-out operation, and so on are performed in units of eight memory cells, i.e. a block A and a block B, are provided, and they are connected to a common word line, i.e. WORD LINE WLn. In addition, the first and second dynamic reference cells DRB, DRA as reference cells at the time when performing a read-out operation on each of the eight memory cells are connected to a common word line, i.e. WORD LINE WLn.

The memory cells and the dynamic reference cells are identified by the same address within an 8-cell unit. In other words, in regard to the memory cells of the block A and the second dynamic reference cell DRA, their trapping regions on the internal side of WORD LINE WLn are first trapping regions. ADDRESSES (from 8 to f) are assigned sequentially in the direction extending from the outermost cell connected to WORD LINE WLn towards the innermost cell connected to WORD LINE WLn. On the other hand, the trapping regions on the external side of WORD LINE WLn are second trapping regions, and ADDRESSES (from 0 to 7) are assigned sequentially in the direction extending from the outermost cell connected to WORD LINE WLn towards the innermost cell connected to WORD LINE WLn.

In addition, in regard to the memory cells of the block B and the first dynamic reference cell DRB, their trapping regions on the internal side of WORD LINE WLn are first trapping regions. ADDRESSES (from 8 to f) are assigned sequentially in the direction extending from the innermost cell connected to WORD LINE WLn towards the outermost cell connected to WORD LINE WLn. On the other hand, the trapping regions on the external side of WORD LINE WLn are second trapping regions, and ADDRESSES (from 0 to 7) are assigned sequentially in the direction extending from the innermost cell connected to WORD LINE WLn towards the outermost cell connected to WORD LINE WLn.

Figure 4:
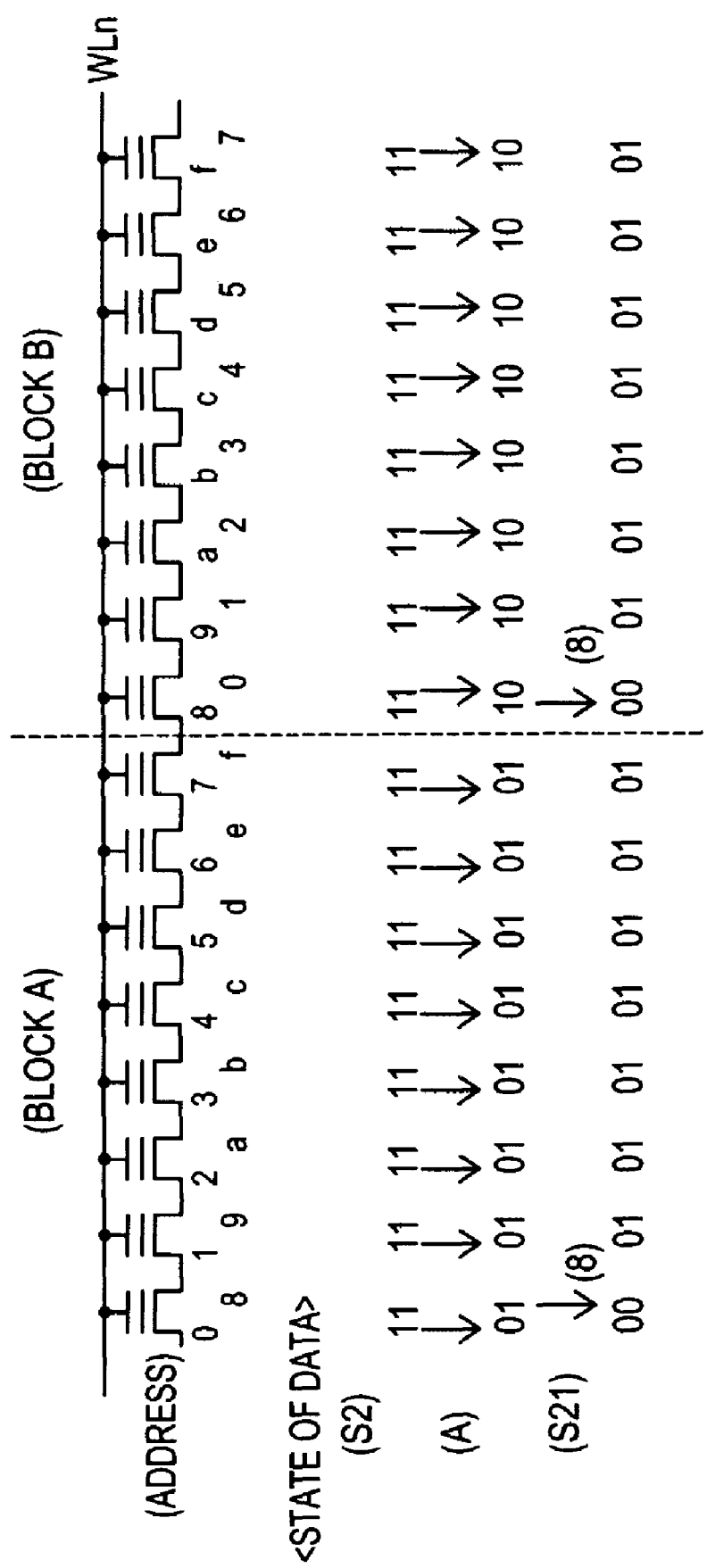
FIG. 4 is a diagram which relates to a first embodiment of the present invention and which illustrates by way of example a case in which a program operation is performed in eight bits on a memory cell (i.e. an Xtreme mode cell) capable of storing 1-bit data depending on the presence or absence of charge in the first trapping region.
Figure 5:
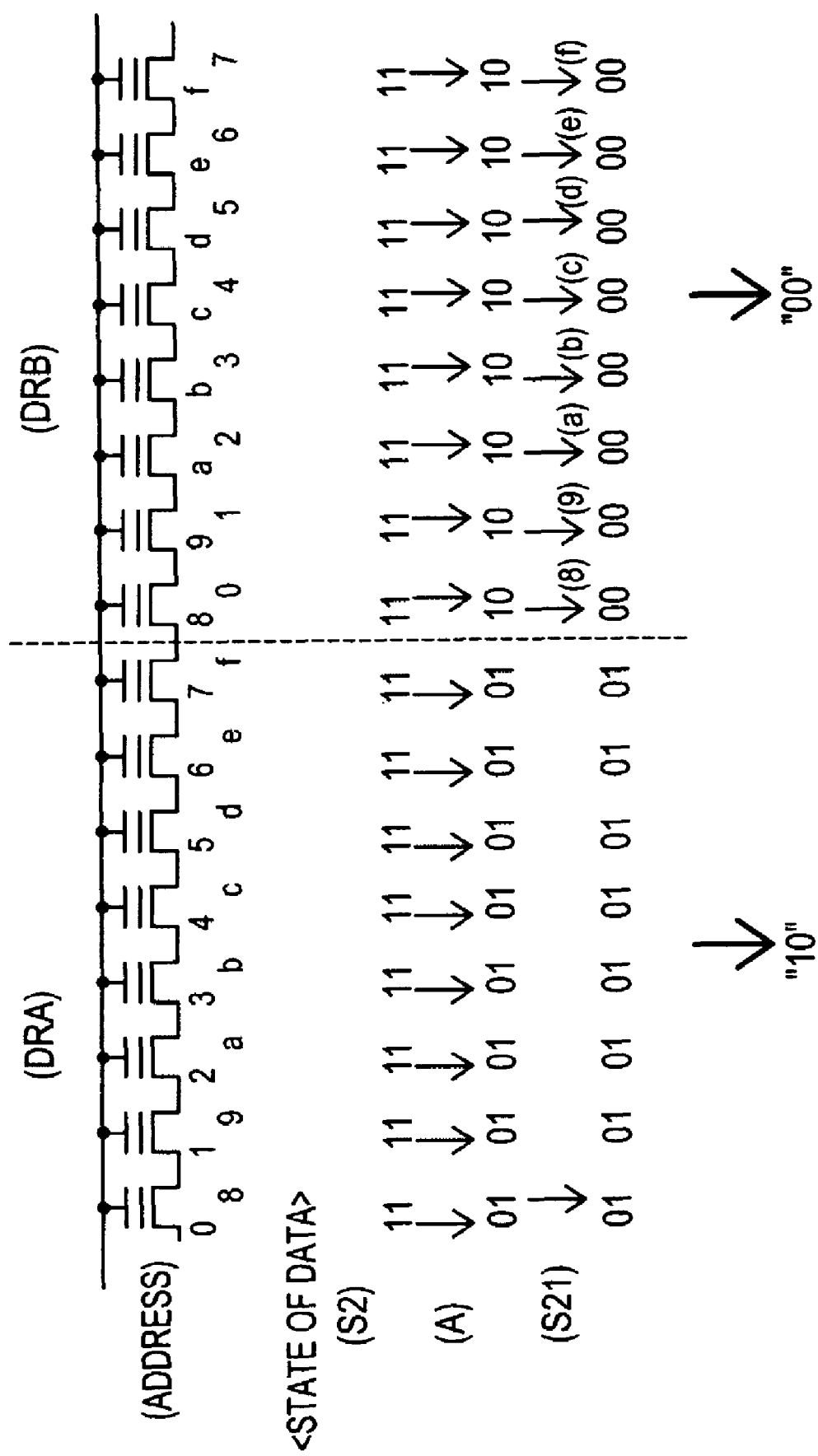
FIG. 5 is a diagram which illustrates an initialization operation for first and second dynamic reference cells which are provided for each memory cell of a unit of eight bits shown in FIG. 4.

As shown in FIG. 4 and FIG. 5, the memory cells of the block A, the memory cells of the block B, the first dynamic reference cell DRB, and the second dynamic reference cell DRA are arranged with their first trapping regions facing the internal side of WORD LINE WLn. As a result of such arrangement, the drain or source terminals at the time of read-out face each other, thereby preventing flow of leak current through the cell. This is a layout technique which is a so-called back to back program technique or/and a so-called back to back lead technique.

Figure 6:
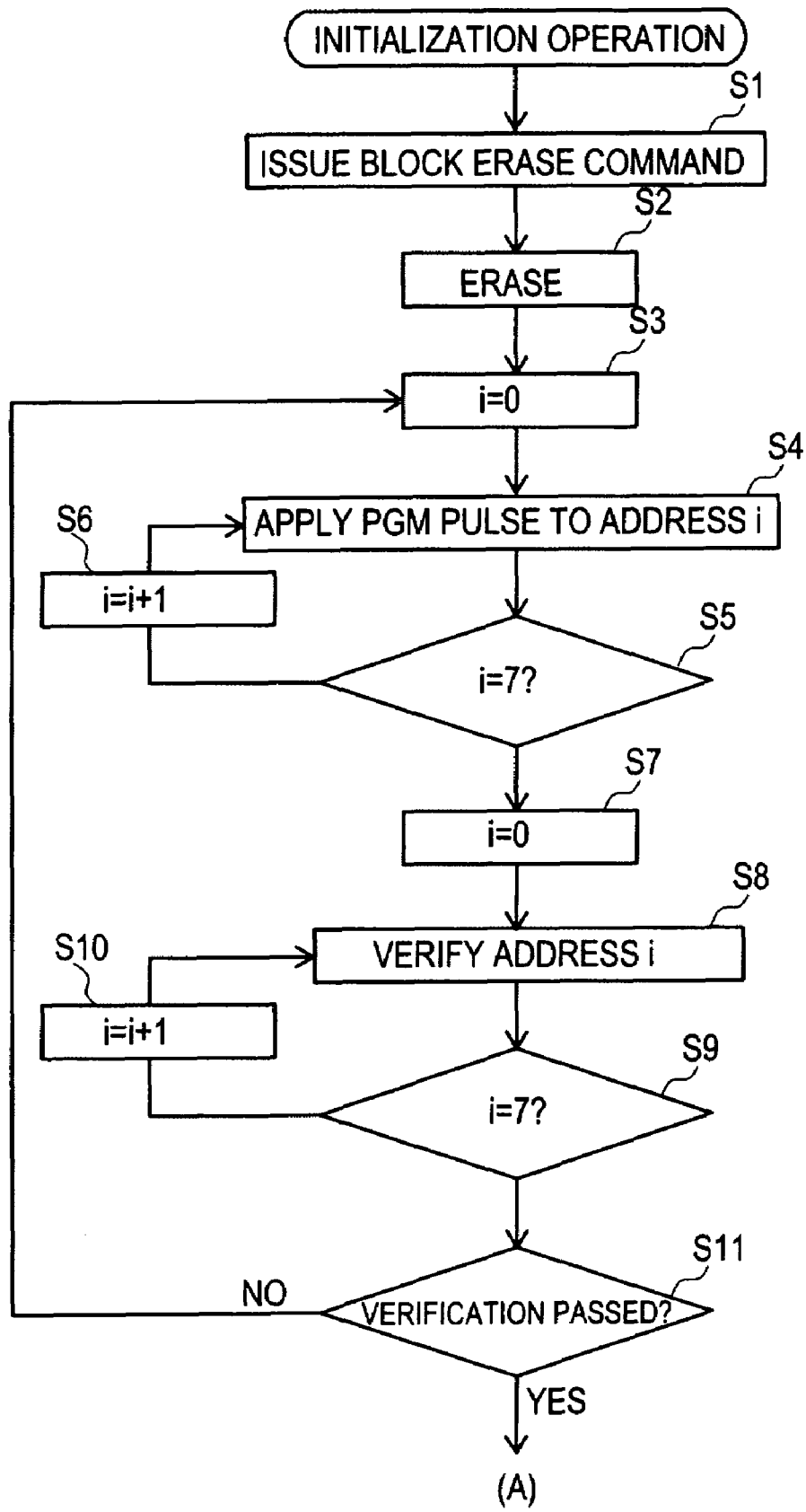
FIG. 6 is a flow chart which illustrates a preset operation in the initialization operation (FIG. 5) and the program operation (FIG. 4) to the memory cell that is performed concurrently with the preset operation.
Figure 7:
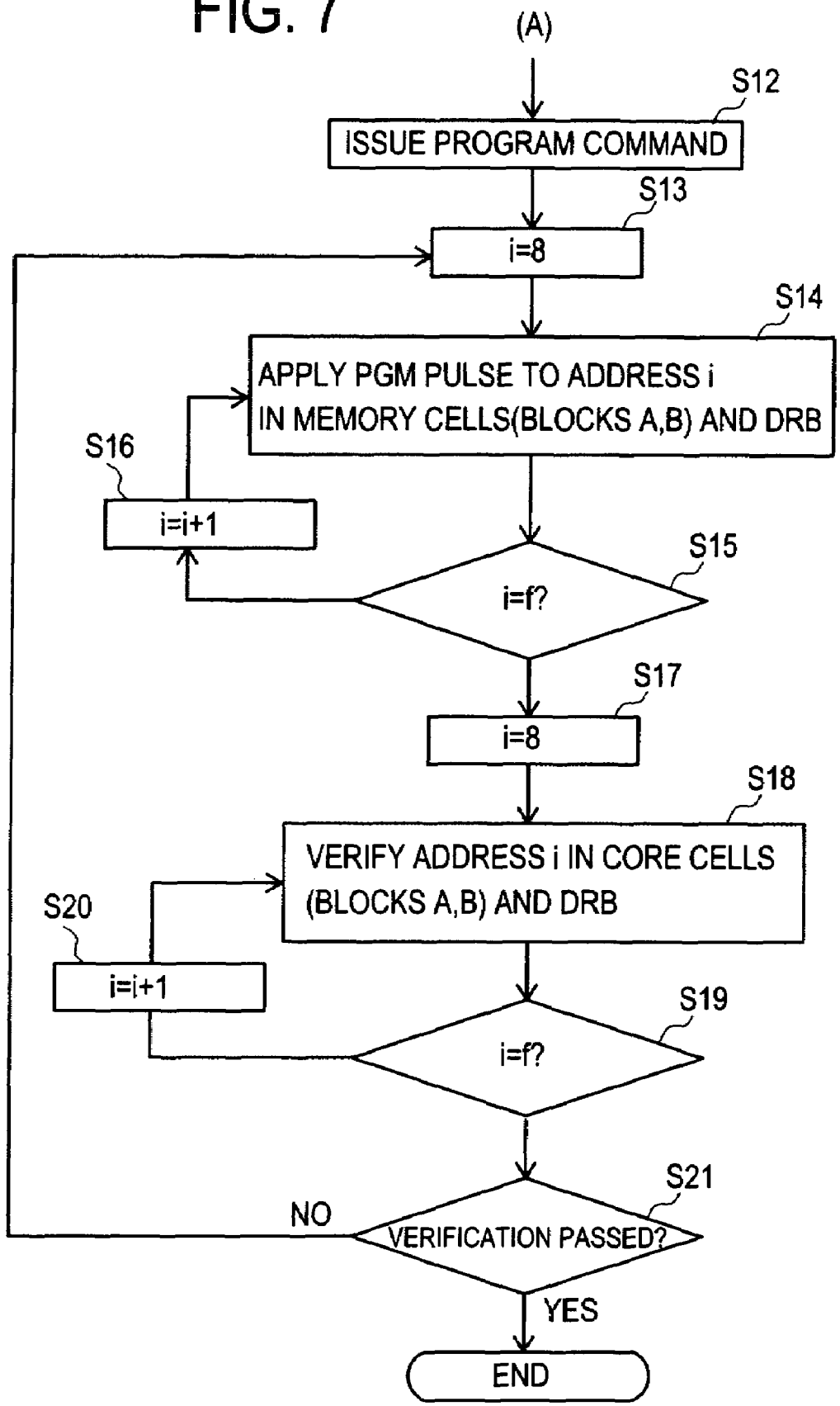
FIG. 7 is a flow chart which illustrates a set operation in the initialization operation (FIG. 5) and the program operation (FIG. 4) to the memory cell that is performed concurrently with the set operation.

FIGS. 6 and 7 represent a flow chart when initializing the first and second dynamic reference cells DRB, DRA concurrently with programming the memory cells of the blocks A, B in the cell configurations of FIG. 4 and FIG. 5. This initialization operation is made up of a preset operation and a set operation. In the following description, by making reference to FIG. 4 and FIG. 5, the flow of initialization shown in FIGS. 6 and 7 is described.

FIG. 6 is a flow for performing a preset operation in the initialization operation of the first and second dynamic reference cells DRB, DRA. When an erase command is issued (step S1), the memory cells of the blocks A, B and the first and second dynamic reference cells DRB, DRA are erased (step S2). As a result of this, all charges accumulated in the first and second trapping regions are ejected out. As shown in FIG. 4 and FIG. 5, in the memory cells of the blocks A, B and in the first and second dynamic reference cells DRB, DRA, the first and second trapping regions enter the charge depletion state and every cell is placed in CHARGE STATE "11".

Address initialization, in which i=0, is carried out (step S3). A bias for programming (PGM) is pulse-applied to ADDRESS i (step S4). This pulse application of the programming bias is carried out while sequentially incrementing ADDRESS i up to i=7 (steps S5, S6). After completion of the program bias pulse application, the address is initialized again (i=0) at step S7, and a program verify operation is performed (step S8). This program verify operation is also carried out while sequentially incrementing ADDRESS i up to i=7 (steps S9, S10). If the program verify operation fails to pass (step S11: NO), then the procedure returns to step S3 and another program operation is performed again. If the program verify operation passes (step S11: YES), then the memory cell preset operation is complete, and the preset operation in the initialization operation of the first and second dynamic reference cells DRB, DRA is complete (STATE (A)). As a result of this, as shown in FIG. 4 and FIG. 5, in the memory cells of the blocks A, B as well as in the first and second dynamic reference cells DRB, DRA, the second trapping regions are placed in the charge accumulation state, and every cell enters CHARGE STATE "10". At this time, with respect to the second dynamic reference cell DRA, its initialization operation is finished.

The procedure then moves to the flow of FIG. 7 from STATE (A), and a set operation of the initialization operation of the first and second dynamic reference cells DRB, DRA is carried out. At this time, the user can access address regions that are ADDRESSES (from 8 to f). Upon the issue of a program command for data to a memory cell (step S12), address initialization, in which i=8, is carried out (step S13), and a bias for programming (PGM) is pulse-applied to ADDRESS i in the memory cells of the blocks A, B as well as in the first and second dynamic reference cells DRB, DRA (step S14). Pulse application of the programming bias is performed while sequentially incrementing ADDRESS i up to i=f (steps S15, S16). After completion of the programming bias pulse application, address initialization, in which i=8, is again performed (step S17), and a program verify operation is performed on the memory cells of the blocks A, B as well as on the first dynamic reference cells DRB (step S18). This program verify operation is also carried out while sequentially incrementing ADDRESS i up to i=f (steps S19, S20). If the program verify operation fails to pass (step S21: NO), then the procedure returns to step S13 and another program operation is performed again. If the program verify operation passes (step S21: YES), the set operation of the initialization operation of the first and second dynamic reference cells DRB, DRA is complete along with the program operation of real data for the blocks A, B.

Here, in the flow of FIG. 7, along with the program operation of real data for the blocks A, B, the set operation of the initialization operation of the first dynamic reference cell DRB is performed. In other words, with respect to the memory cells of the blocks A, B, a program bias is pulse-applied only to a memory cell which becomes a target for programming. In FIG. 4, of the memory cells at ADDRESSES (from 8 to f), a program operation is performed on ADDRESS 8. As a result of this, the target memory cell enters CHARGE STATE "00".

On the other hand, with respect to the first dynamic reference cell DRB, a program bias is applied to every cell. In FIG. 5, a program operation is performed on the memory cells at ADDRESSES (from 8 to f). As a result of this, the first dynamic reference cell DRB enters CHARGE STATE "00". Note that no program operation is performed on the second dynamic reference cell DRA which therefore is maintained in CHARGE STATE "10".

To sum up, the first dynamic reference cell DRB is set to CHARGE STATE "00" and the second dynamic reference cell DRA remains in CHARGE STATE "10".

In Xtreme MODE in which a memory cell provided with a trapping dielectric layer serves as a 1-bit storage cell, the second trapping region of the memory cell is placed in the charge accumulation state and, at the same time, the preset operation in the initialization operation of the first and second dynamic reference cells DRB, DRA is carried out, whereby the first and second dynamic reference cells DRB, DRA can be set to CHARGE STATE "10". Consequently, in the set operation of the initialization operation performed concurrently with programming of data to the memory cell, it suffices if a program operation is performed only on the first trapping region of the first dynamic reference cell DRB. This makes it possible to shorten the time needed for dynamic reference cell initialization.

In addition, in the set operation in the initialization operation, at the time when programming the first trapping region of the first dynamic reference cell DRB, the second trapping region is at "0". It is well known at the cell having an insulating trapping layer that, when performing a program operation on one trapping region in a memory cell provided with a trapping dielectric layer, the amount of threshold voltage shift by an applied bias in the program operation is great if the charge state of the other trapping region is at "0", in comparison with at "1", whereby the program time can be shortened. Since the charge state of the second trapping region is at "0", this makes it possible to shorten the time needed for programming to the first trapping region of the first dynamic reference cell DRB.

The number of dynamic reference cells that require a program operation is reduced to half and, in addition, it becomes possible to shorten the individual program time. As a result, the time needed for the initialization operation of the first and second dynamic reference cells DRB, DRA can be shortened.

Figure 8:
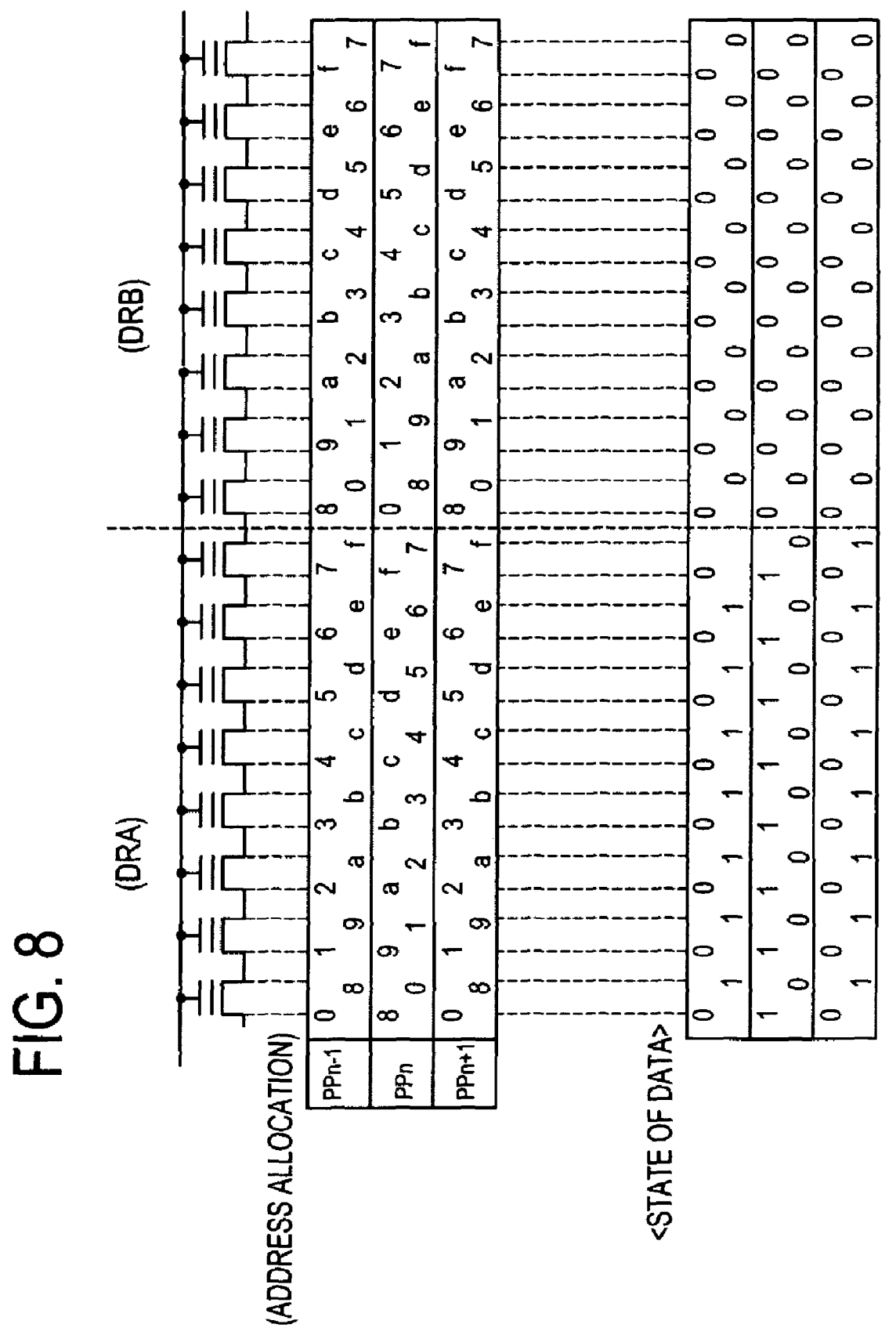

With reference to FIG. 8, the description will be made by taking as an example a memory cell array configuration (see FIGS. 4 and 5) which are parts of the first and second dynamic reference cells DRB, DRA provided in PARTIAL PAGE (PPn−1, PPn, PPn+1) of the memory cell array of FIG. 3. In FIG. 8, between two adjacent partial pages, the first and second trapping regions provided in the first and second dynamic reference cells DRB, DRA are allocated inversely with each other.

Addresses for identifying the first trapping regions are allocated to from 8 to f, and addresses for identifying the second trapping regions are allocated to from 0 to 7. In regard to PARTIAL PAGES PPn−1, PPn+1, ADDRESSES (from 8 to f) are allocated to trapping regions of the cells on the internal side of the word line. The internal side trapping regions are first trapping regions. The external side trapping regions are assigned ADDRESSES (from 0 to 7). On the other hand, in regard to PARTIAL PAGE PPn, ADDRESSES (from 8 to f) are allocated to trapping regions of the cells on the external side of the word line. The external side trapping regions are first trapping regions. The internal side trapping regions are assigned ADDRESSES (from 0 to 7).

As a result of the above, the second dynamic reference cell DRA which is placed in CHARGE STATE "10" is, in regard to PARTIAL PAGES PPn−1, PPn+1, at STATE "1" on the internal side of each cell and at STATE "0" on the external side of each cell. On the other hand, in regard to PARTIAL PAGE PPn, the external side of each cell is at STATE "1" and the internal side of each cell is at STATE "0". STATES "1" and "0" are alternately arranged between adjacent partial pages. That is, a so-called checkerboard pattern is formed. Since, at the time of bias application in a read-out operation, the bias application state is inverted between adjacent partial pages, this makes it possible to prevent the occurrence of a disturb phenomenon.

Figure 9:
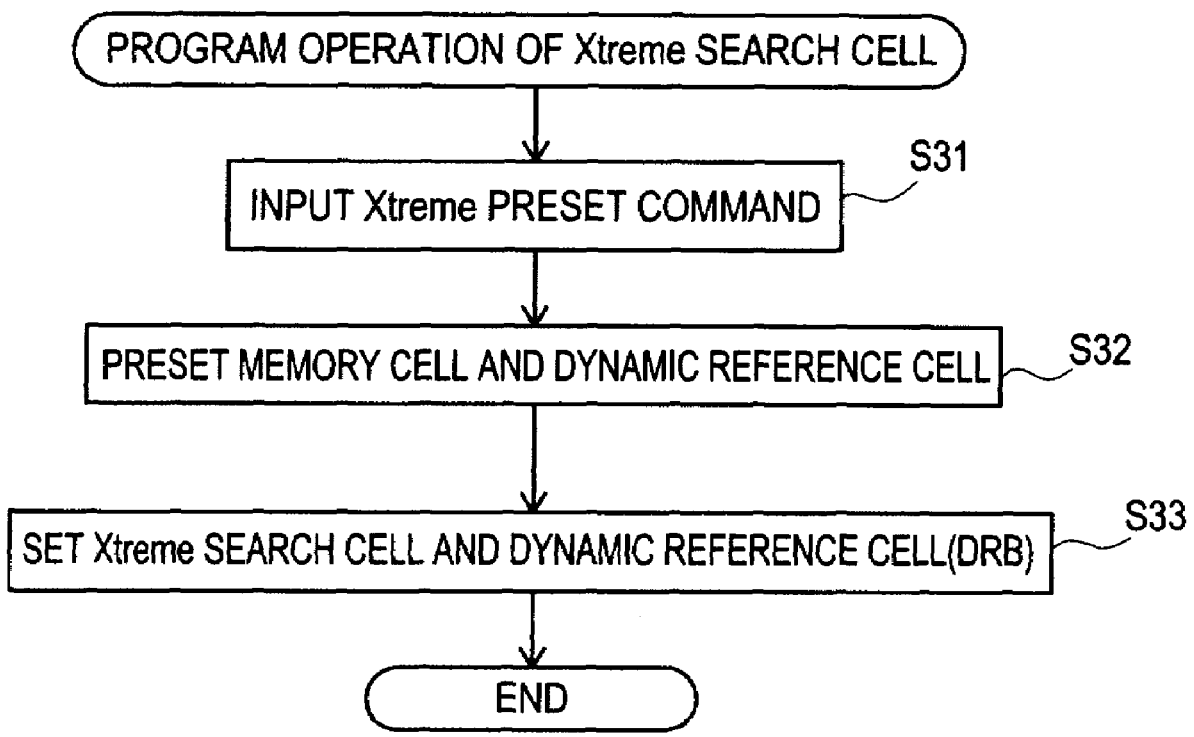
FIG. 9 is a flow chart which relates to a second embodiment of the present invention and which illustrates a program operation on a mode search cell and a blank check cell.
Figure 10:
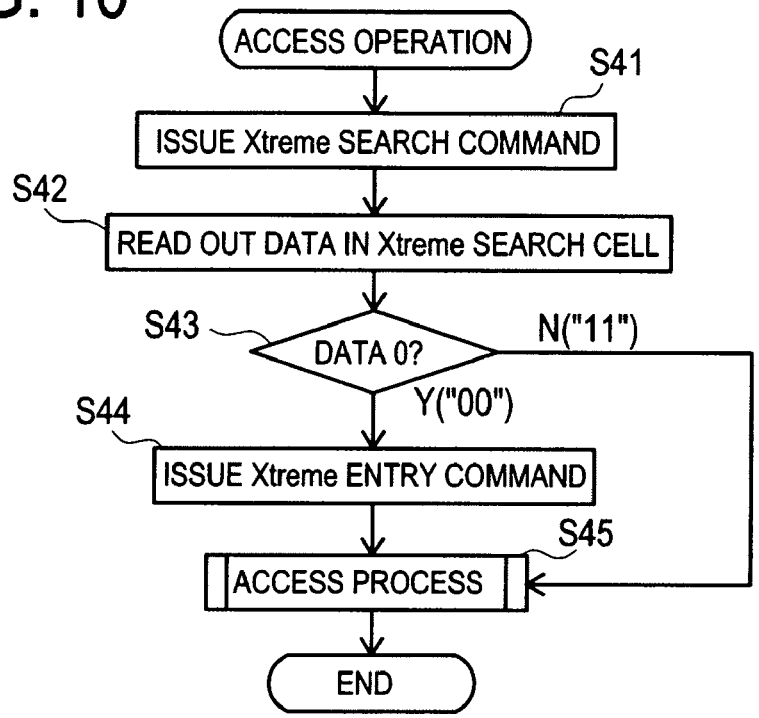
FIG. 10 is a flow chart which illustrates an access operation on a memory cell provided with a mode search cell.
Figure 11:
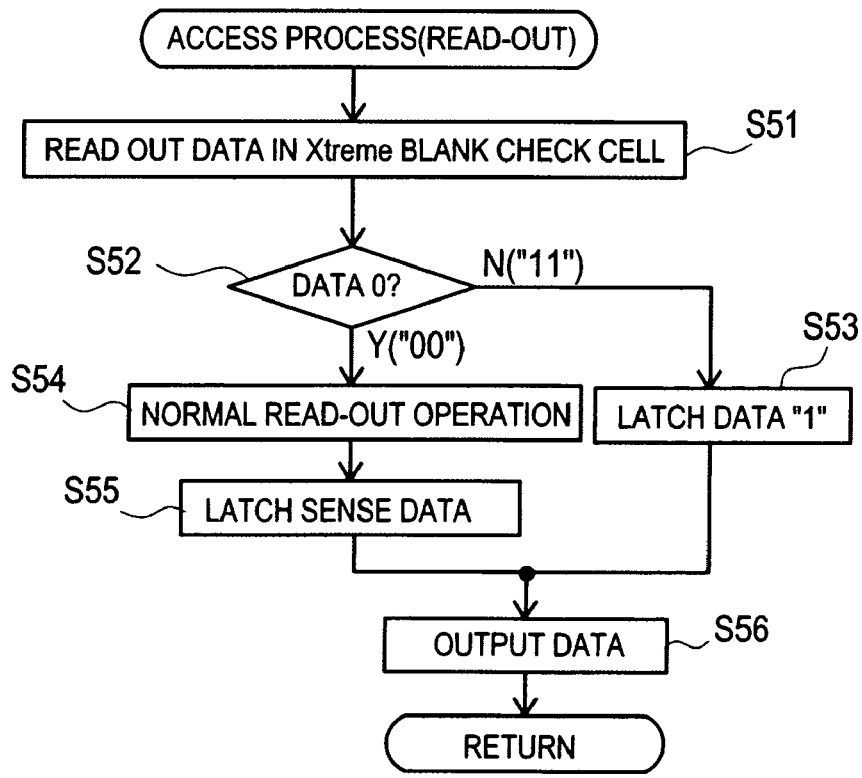
FIG. 11 is a flow chart which illustrates an access operation on a memory cell provided with a blank check cell.

FIGS. 9-11 are flow charts for the purpose of providing a description of a second embodiment of the present invention. The flow chart of FIG. 9 represents a program operation flow of the Xtreme search cell XSC described in FIG. 3. The flow chart of FIG. 10 represents a flow of determining the contents of the Xtreme search cell XSC prior to an access operation. The flow chart of FIG. 11 represents a flow of determining the contents of the Xtreme blank check cell XBC in a read-out access process.

The Xtreme search cell XSC is an example of a mode search cell. A mode search cell is a dedicated cell which is provided to store the difference whether the sector operating mode is NORMAL MODE in which two bits are stored per memory cell or Xtreme MODE in which one bit is stored per memory cell. If the sector operating mode is NORMAL MODE, then the charge state is set to "11" in which both the first and second trapping regions are erased. If the sector operating mode is Xtreme MODE, the charge state is set to "00" in which both the first and second trapping regions are programmed. "11", in which the threshold voltage distribution is further distributed at low voltage, is selected from among the two different charge states "00", "11" existing as states of data "1", so that even when charge losses occur with time in the state "00" of data "0", the difference in storage mode is held surely and the data can be read out. The Xtreme search cell XSC is read out outwardly by a dedicated Xtreme search command.

The Xtreme search cell is set subsequent to the preset operation of the initialization operation of the dynamic reference cells previously described. More specifically, the Xtreme search cell is set to STATE "00" when an erase command is inputted or when an Xtreme preset command is inputted, with an Xtreme mode command inputted to the device. For example, when an Xtreme preset command is inputted (step S31), a preset operation is performed which places both the memory cells and the dynamic reference cells in STATE "10" (step S32). Subsequently, a set operation is performed on DRB (step S33). During this set operation, a program operation is performed on XSC. Accordingly, at step S33, by performing programming about ADDRESSES (from 8 to f) along with the set operation of the first dynamic reference cell DRB and thereafter performing programming about ADDRESSES (from 0 to 7), the Xtreme search cell XSC is set to STATE "00". This flow is shown in FIG. 9.

Here, in the configuration of FIG. 3, an Xtreme search cell XSC of a single cell is provided per word line. It suffices if a single Xtreme search cell XSC is provided for each region in which a bit data storage mode is set, e.g. for each sector which is an erase unit.

The Xtreme blank check cell XBC is an example of a blank check cell. A blank check cell stores information that is indicative of whether the initialization operation of the dynamic reference cells is complete or not in Xtreme MODE. The contents of the Xtreme blank check cell XBC are confirmed when performing a read-out operation, thereby making it possible to confirm that the initialization operation of the dynamic reference cells has been completed. Consequently, it becomes possible to prevent the occurrence of an erroneous read-out operation due to the state that the dynamic reference cells have not been initialized yet. If the dynamic reference cells are not yet initialized (i.e. they are in the blank state), the charge state is set to "11" in which both the first and second trapping regions are erased. In the state in which the initialization operation is complete, the charge state is set to "00" in which both the first and second trapping regions are programmed. "11", in which the threshold voltage distribution is further distributed at low voltage, is selected from among the two different charge states "00", "11" existing as states of data "1", so that even when charge losses occur with time in the state "00" of data "0", the initialization state of the dynamic reference cells is held surely and the data can be read out.

The Xtreme blank check cell XBC is set subsequent to the preset operation of the previously described initialization operation of the dynamic reference cells. More specifically, the Xtreme blank check cell XBC is set to STATE "00" at the time of the set operation of the first dynamic reference cell.

In the case where dynamic reference cell initialization is performed in response to the writing of data to a memory cell, it suffices if information is stored in a single Xtreme search cell XSC per data write operation unit.

Here, in FIG. 3, the partial page is created per WORD LINE WLn in Xtreme MODE, while in NORMAL MODE two partial pages are created per WORD LINE WLn. Since the dynamic reference cell is provided per partial page, it is preferred that two Xtreme blank check cells XBC are provided in WORD LINE WLn. In regard to the Xtreme search cell XSC, a single XSC provided per sector is used to store information about whether the memory cell is preset or not.

In this case, in regard to Xtreme search cells XSC and Xtreme blank check cell XBC that are not used, preferably both the first and second regions are placed in the write state. As a result of such arrangement, the threshold voltage increases, thereby making it possible to provide electric isolation between the internal side region of WORD LINE WLn to which the memory cells MC, the dynamic reference cells DRA, DRB et cetera are connected and the external side region of WORD LINE WLn to which the dummy cells DS are connected. Consequently, unnecessary current paths are not formed between the dummy cells DC and the other cells, thereby making it possible to prevent the operating margin of write and read-out operations of bit data from deteriorating.

As shown in FIG. 10, with the start of a data access operation, an Xtreme search command is issued (step S41). As a result of this, data stored in the Xtreme search cell XSC is read out to outside the device (step S42) and the contents of the data are determined (step S43). If the charge state is at "11" and data "0" is not stored (step S43: NO), this is determined as a non Xtreme preset state, and the procedure moves to a normal access process (step S45). On the other hand, if the charge state is at "00" and data "0" is stored (step S43: YES), this is determined as an Xtreme preset state. While waiting for an Xtreme entry command to be inputted (step S44), the procedure moves to an access process (step S45).

Referring to FIG. 11, there is shown a flow in the case where the access process (step S45) is a read-out process. In this case, data stored in the Xtreme blank check cell XBC is read out within the device (step S51), and the contents of the data is determined (step S52). If the charge state is at "11" and data "0" is not stored (step S52: NO), it is determined that the dynamic reference cell is not in the initialization state. This means that no write operation is performed on the memory cell. Therefore, data "1" is latched by a latch circuit (not shown) at step S53. The latched data "1" is then forcefully outputted to outside the device (step S56). If the charge state is at "00" and data "0" is stored (step S52: YES), it is determined that the dynamic reference cell is in the initialization state, and a normal read-out operation is carried out (step S54). Sense data sensed in the normal read-out operation is latched by a latch circuit (not shown) at step S55. Then, the latched data is outputted outwardly (step S56).

By virtue of the data stored in the Xtreme search cell XSC, it becomes possible to surely make a distinction in mode select state between Xtreme MODE in which 1-bit data is stored per memory cell depending on the presence or absence of charge in the first trapping region and NORMAL MODE in which 2-bit data is stored per memory cell depending on the presence or absence of charge in each of the first and second trapping regions.

By virtue of the data stored in the Xtreme blank check cell XBC, it becomes possible to surely determine whether or not the dynamic reference cell is in the initialization state.

Figure 12:
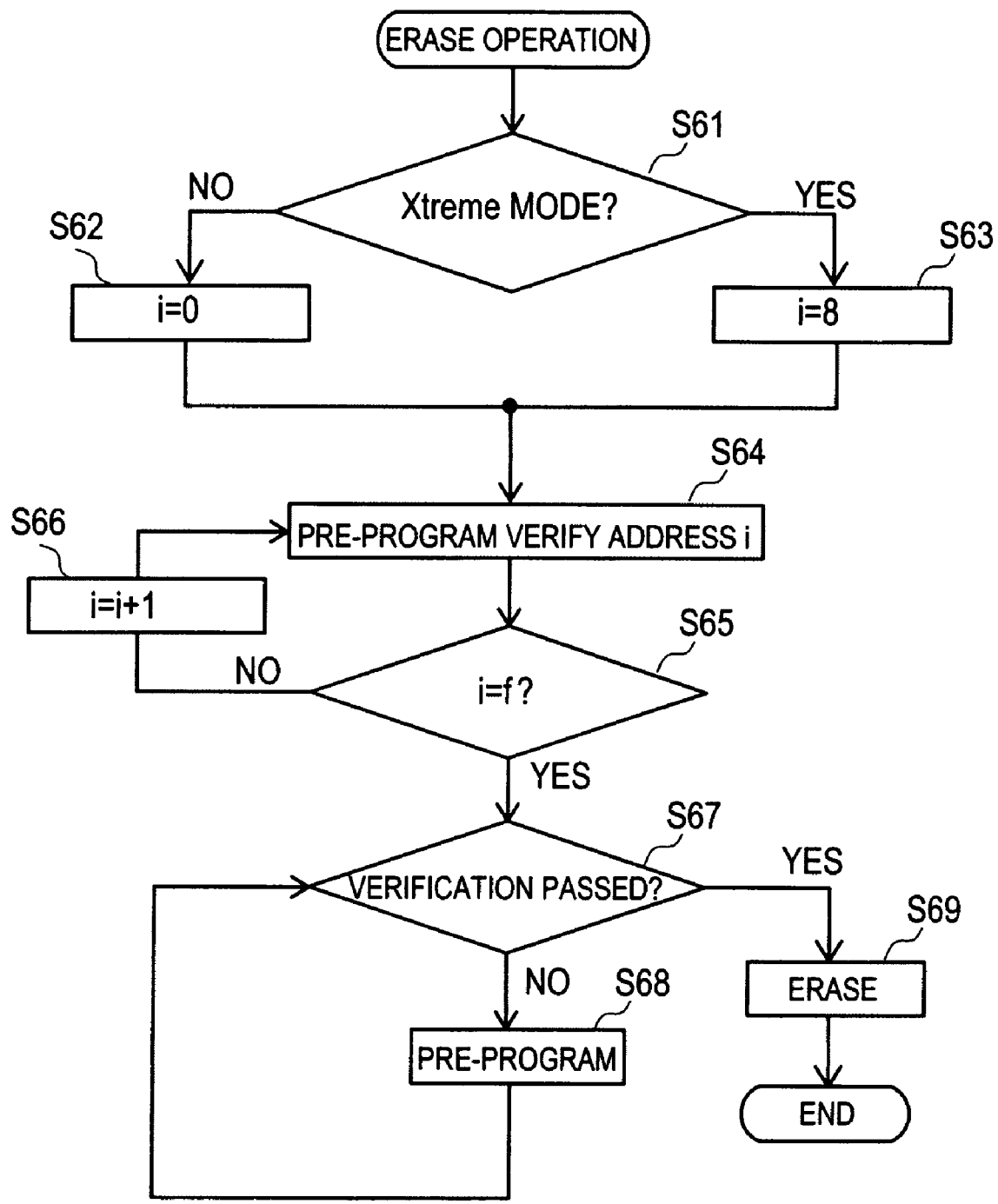
FIG. 12 is a flow chart which relates to a third embodiment of the present invention and which illustrates a pre-program operation that is performed prior to an erase operation at the time of data rewrite.
Figure 13:
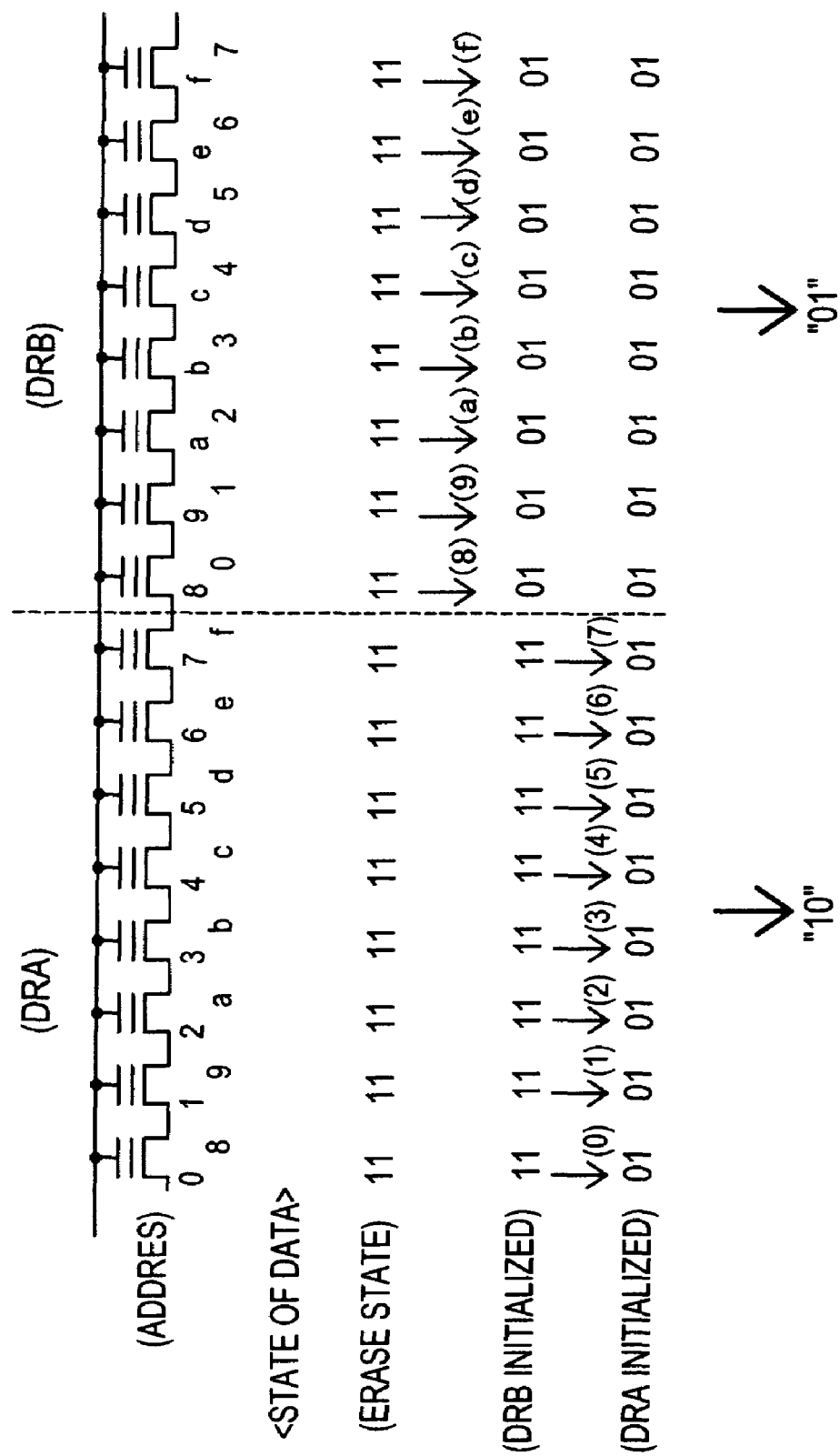
FIG. 13 is a diagram which relates to the background art and which illustrates by way of example a case in which a program operation is performed in a unit of eight bits on a memory cell (i.e. an Xtreme mode cell) capable of storing 1-bit data depending on the presence or absence of charge in the first trapping region.

FIG. 12 is a flow chart for the purpose of providing a description of a third embodiment of the present invention. In the nonvolatile storage device, at the time of data rewrite, all memory cells must be erased prior to the rewriting of data. In this case, in order to avoid an over erase state, it is preferred that every memory cell is once placed in the program state. This is a so-called pre-program operation. The contents of the flow chart of FIG. 12 are based on the memory cell configuration of FIG. 4.

When an erase operation starts, whether it is Xtreme preset or not is confirmed (step S61). This is determined by reading out XSC within the device. If not Xtreme-preset (step S61: NO), then the address initial value is set to i=0 (step S62). If Xtreme-preset (step S61: YES), then the address initial value is set to i=8 (step S63). After the address initial value is set, a pre-program verify operation is performed on ADDRESS i (step S64). This verify operation is sequentially performed up to the last address (i=f) (steps S65, S66). Thereafter, if the program verify operation fails to pass (step S67: NO), a pre-program operation is performed (step S68). The pre-program operation (step S68) is performed until it passes in the verify operation. When the program verify operation passes for every address (step S67: YES), an erase operation is carried out (step S69).

Since, in NORMAL MODE, both the first and second trapping regions of the memory cell are used as data storage regions, this requires that a pre-program verify operation be performed on each of the first and second trapping regions. In the case where the charge state is at "1" (i.e., the charge depletion state), then a pre-program operation must be carried out. Accordingly, it is necessary to set the address initial value to i=0 (step S62) and then perform a pre-program verify operation up to the last address (i=f), and further a pre-program operation if required.

On the other hand, in Xtreme MODE, the second trapping region of each memory cell is placed in the charge accumulation state (preset state) after data is programmed to the first trapping region thereof. The charge state is at "0". Accordingly, at the time of data rewrite, it suffices if pre-program verification, and pre-programming (if required) are performed only on the first trapping region. Because of this, it suffices if the address initial value is set at i=8 and pre-program verification, and pre-programming (if required) are performed on the memory cells up to the last address (i=f). In Xtreme MODE, it becomes possible to shorten the time taken to perform a pre-program operation at the time of data rewrite, thereby making it possible to shorten the time taken for the rewriting of data.

As can be seen in the above description, in accordance with the first embodiment, when the nonvolatile storage device is used in Xtreme MODE, both the first and second trapping regions of the first dynamic reference cell DRB are placed in the charge accumulation state, while on the other hand in regard to the first trapping region of the second dynamic reference cell DRA is placed in the charge depletion state and the second trapping region of the second dynamic reference cell DRA is placed in the charge accumulation state.

It becomes possible to perform, to the setting of the second trapping region of the memory cell to the charge accumulation state, the preset operation of the initialization operation of the first and second dynamic reference cells DRB, DRA, and prior to the set operation the first and second dynamic reference cells DRB, DRA can be placed in CHARGE STATE "10". In the set operation, by performing a program operation on the first trapping region of the first dynamic reference cell DRB, bit data values "0" and "1" can be stored in the first and second dynamic reference cells DRB, DRA, respectively.

In the set operation, there is no need to program the first trapping region of the second dynamic reference cell DRA, thereby making it possible to shorten the time taken for the set operation.

In addition, in the set operation, when programming the first trapping region of the first dynamic reference cell DRB, the second trapping region is at "0". It is well known at the cell having an insulating trapping layer that, when performing a program operation on one trapping region in a memory cell provided with a trapping dielectric layer, the amount of threshold voltage shift by an applied bias in the program operation is great if the charge state of the other opposing trapping region is at "0", in comparison with at "1". This makes it possible to shorten the program time. As a result, it becomes possible to shorten the time taken to program the first trapping region of the first dynamic reference cell DRB.

The number of dynamic reference cells that require a program operation is reduced to half and, in addition, it becomes possible to shorten the individual program time. As a result, the time needed for the initialization operation of the first and second dynamic reference cells DRB, DRA can be shortened.

In addition, in accordance with the second embodiment, since the Xtreme search cell XSC or the Xtreme blank check cell XBC is provided, this makes it possible to surely detect, without failing, whether the mode is Xtreme MODE or NORMAL MODE or whether the dynamic reference cell is in the initialization state or not.

Besides, in accordance with the third embodiment, since, in Xtreme MODE, the second trapping region where no bit data is stored maintains in the program state, it suffices if pre-program verification that is performed at the time of data rewrite, and pre-programming that is performed as needed are performed only on the first trapping region. This makes it possible to reduce the time taken for the rewriting of data.

Embodiments generally relate to semiconductor devices. More particularly, embodiments provide for nonvolatile storage device controlling which shortens the operating time either by contriving dynamic reference cell initialization in a program operation prior to a data read-out operation or optimiz a pre-program operation at the time of data rewrite. In one implementation, the various embodiments are applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive nagivation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells", each of which traditionally stores one bit of information. However, newer flash memory devices, such as MirrorBit® Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, flash memory that utilizes MirrorBit® technology has several key advantages. For example, flash memory that utilizes MirrorBit® technology is capable of burst-mode access as fast as 80 MHz, page access times as fast as 25 ns, simultaneous read-write operation for combined code and data storage, and low standby power (e.g., 1 µA).

Figure 14:
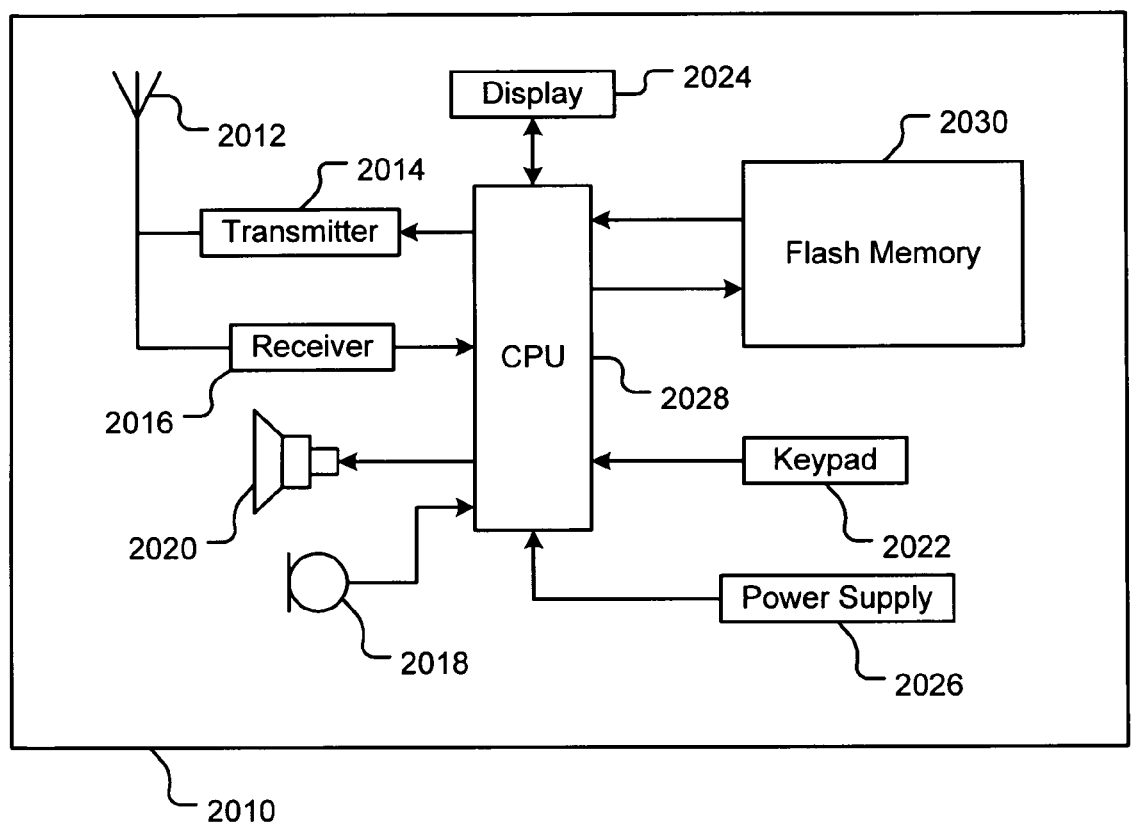
FIG. 14 illustrates a block diagram of a conventional portable phone, upon which embodiments may be implemented.

FIG. 14 shows a block diagram of a conventional portable telephone 2010 (e.g., cell phone, cellular phone, mobile phone, internet protocol phone, wireless phone, etc.), upon which embodiments can be implemented. The cell phone 2010 includes an antenna 2012 coupled to a transmitter 2014 and a receiver 2016, as well as a microphone 2018, a speaker 2020, a keypad 2022, and a display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes a memory cell including first and second diffusion layers and an insulating trapping layer located close to the first and second diffusion layers and having first and second trapping regions for trapping charges therein; a first dynamic reference cell having an equivalent structure to the memory cell wherein the first trapping region of the first dynamic reference cell is set in a charge accumulated state; a second dynamic reference cell having an equivalent structure to the memory cell wherein the first trapping region of the second dynamic reference cell is set in a charge depleted state; and a circuit for initializing the first and second dynamic reference cells when a data storage operation stores one-bit data in accordance with the presence or absence of charges in the first trapping region of the memory cell, the circuit comprising: a presetting circuit for presetting the second trapping regions of the memory cell, first and second dynamic reference cells into the charge accumulated state; and a setting circuit for setting the first trapping region of the first dynamic reference cell into the charge accumulated state in accordance with the data storage operation of the memory cell after the presetting circuit presets the second trapping regions of the memory cell, first and second dynamic reference cells into the charge accumulated state. According to various embodiments, it is possible to control a semiconductor device, such as flash memory, such that the operating time may be shortened either by contriving dynamic reference cell initialization in a program operation prior to a data read-out operation or by optimizing a pre-program operation at the time of data rewrite. As a result, the flash memory 2030 is faster and more efficient. This increased speed and efficiency for the flash memory translates into increased speed and efficiency for various devices, such as mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a less expensive flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 15:
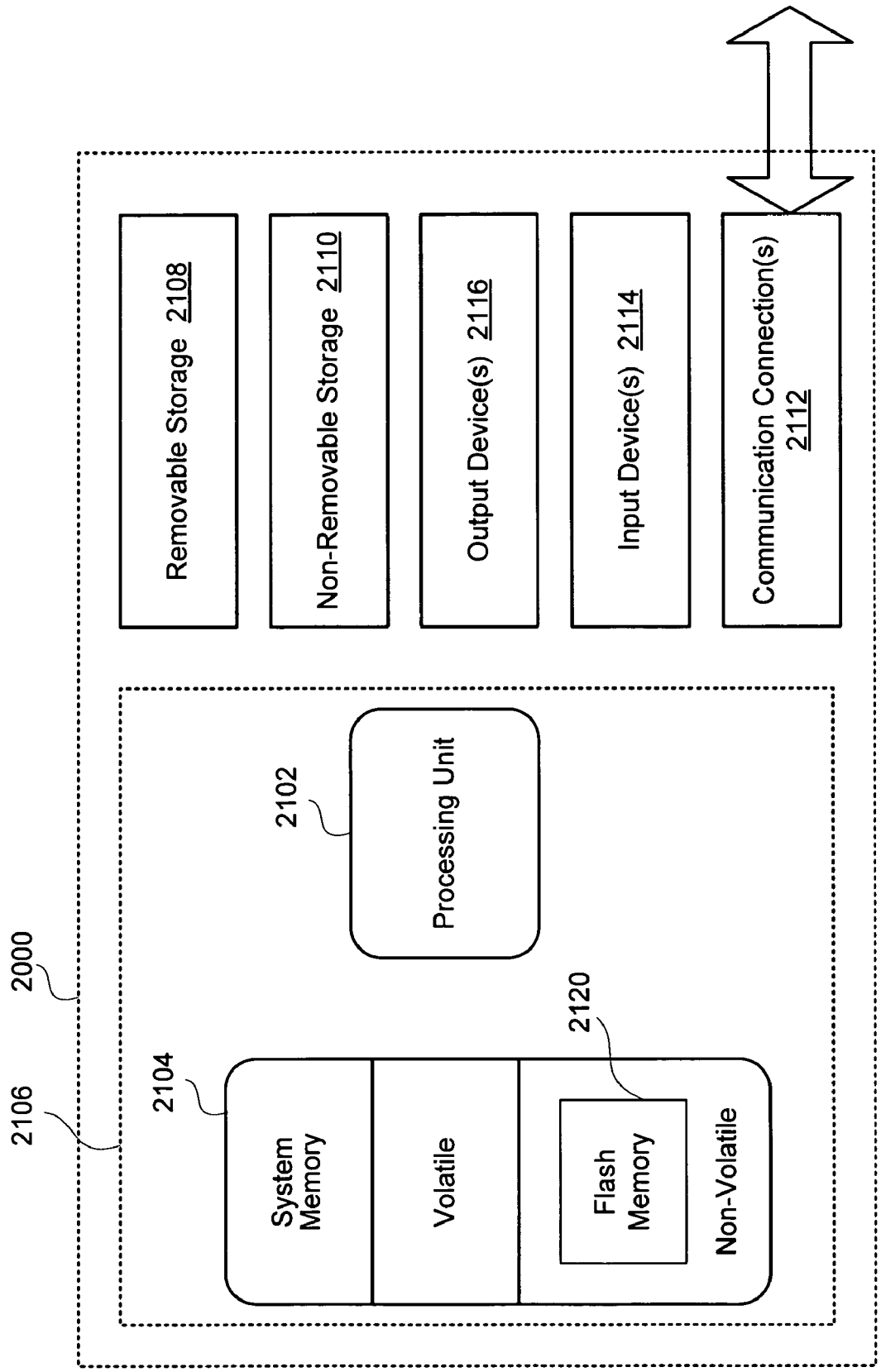
FIG. 15 illustrates a block diagram of a computing device, upon which embodiments may be implemented.

FIG. 15 illustrates a block diagram of a computing device 2100, upon which embodiments of the present claimed subject matter can be implemented. Although computing device 2100 is shown and described in FIG. 15 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing device 2100 can include additional components not shown in FIG. 15.

Also, it is appreciated that the computing device 2100 can be a variety of things. For example, computing device 2100 may be, but is not limited to, a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounter frequent physical impacts. Also, flash memory is more able than other types of memory to withstand intense physical pressure and/or heat. Thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 11 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 15 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises: a memory cell including first and second diffusion layers and an insulating trapping layer located close to the first and second diffusion layers and having first and second trapping regions for trapping charges therein; a first dynamic reference cell having an equivalent structure to the memory cell wherein the first trapping region of the first dynamic reference cell is set in a charge accumulated state; a second dynamic reference cell having an equivalent structure to the memory cell wherein the first trapping region of the second dynamic reference cell is set in a charge depleted state; and a circuit for initializing the first and second dynamic reference cells when a data storage operation stores one-bit data in accordance with the presence or absence of charges in the first trapping region of the memory cell, the circuit comprising: a presetting circuit for presetting the second trapping regions of the memory cell, first and second dynamic reference cells into the charge accumulated state; and a setting circuit for setting the first trapping region of the first dynamic reference cell into the charge accumulated state in accordance with the data storage operation of the memory cell after the presetting circuit presets the second trapping regions of the memory cell, first and second dynamic reference cells into the charge accumulated state. According to various embodiments, it is possible to provide a semiconductor device, such as flash memory, such that the operating time may be shortened either by contriving dynamic reference cell initialization in a program operation prior to a data read-out operation or by optimizing a pre-program operation at the time of data rewrite. As a result, the flash memory 2030 is faster and more efficient. This increased speed and efficiency for the flash memory translates into increased speed and efficiency for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. Further, in one embodiment, the flash memory 2120 utilizes MirrorBit® technology to allow storing of two physically distinct bits on opposite sides of a memory cell.

Device 2100 may also contain communications connection(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Users would also benefit from reduced memory read time and reduced cost.

Figure 16:
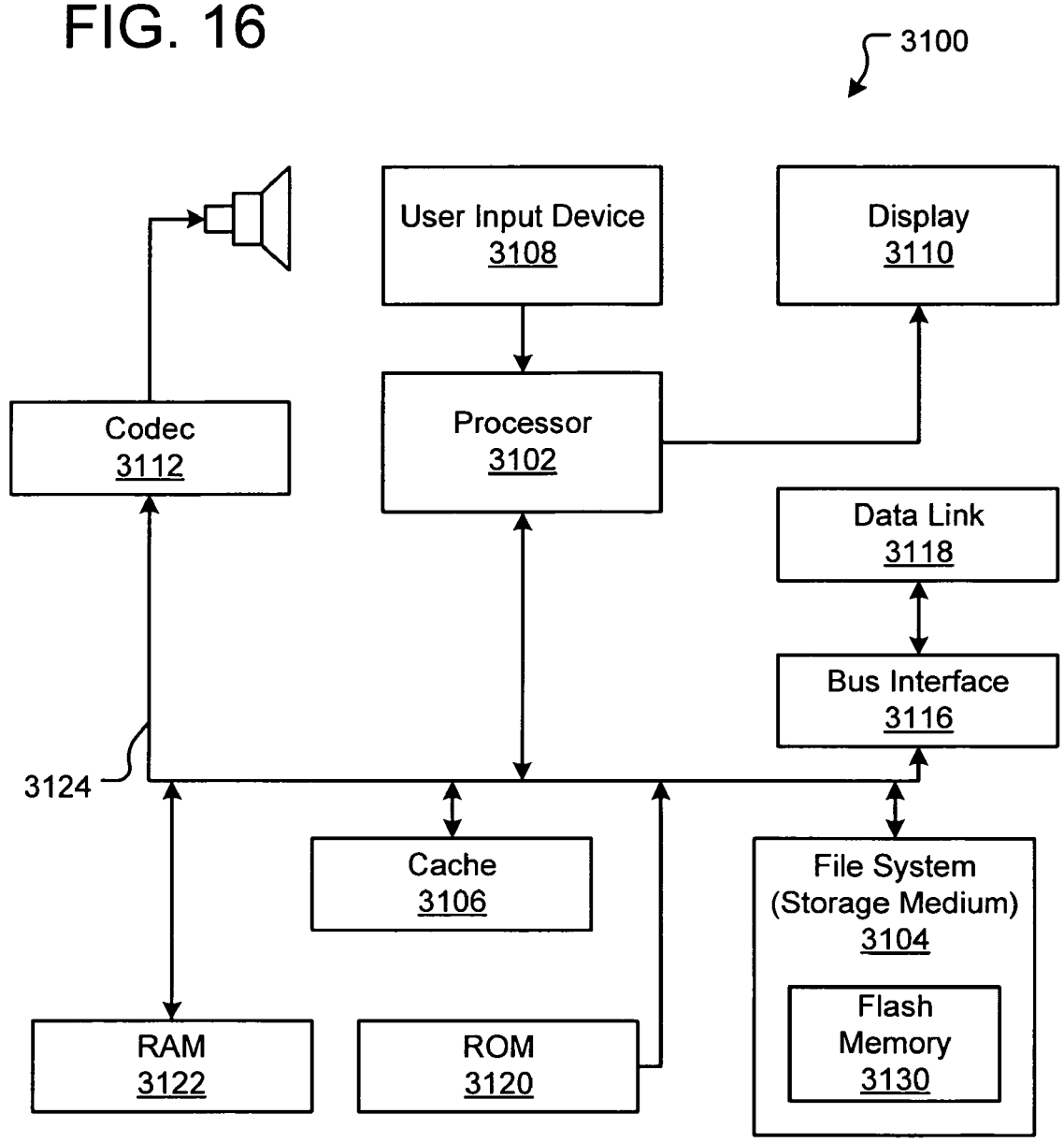
FIG. 16 illustrates an exemplary portable multimedia device, or media player, in accordance with various embodiments of the present invention.

FIG. 16 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage medium or a plurality of storage media, such as disks, memory cells, and the like. The file system 3104 typically provides high capacity storage capability for the media player 3100. Also, file system 3104 includes flash memory 3130. In the present embodiment, the flash memory 3130 comprises: a first dynamic reference cell having an equivalent structure to the memory cell wherein the first trapping region of the first dynamic reference cell is set in a charge accumulated state; a second dynamic reference cell having an equivalent structure to the memory cell wherein the first trapping region of the second dynamic reference cell is set in a charge depleted state; and a circuit for initializing the first and second dynamic reference cells when a data storage operation stores one-bit data in accordance with the presence or absence of charges in the first trapping region of the memory cell, the circuit comprising: a presetting circuit for presetting the second trapping regions of the memory cell, first and second dynamic reference cells into the charge accumulated state; and a setting circuit for setting the first trapping region of the first dynamic reference cell into the charge accumulated state in accordance with the data storage operation of the memory cell after the presetting circuit presets the second trapping regions of the memory cell, first and second dynamic reference cells into the charge accumulated state. According to various embodiments, it is possible to provide a semiconductor device, such as flash memory, such that the operating time may be shortened either by contriving dynamic reference cell initialization in a program operation prior to a data read-out operation or by optimizing a pre-program operation at the time of data rewrite. As a result, the flash memory 2030 is faster and more efficient. This increased speed and efficiency for the flash memory translates into increased speed and efficiency for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the media player 3100 or external to the media player 3100. For example, headphones or earphones that connect to the media player 3100 would be considered an external speaker.

In a particular embodiment, the available media assets are arranged in a hierarchical manner based upon a selected number and type of groupings appropriate to the available media assets. For example, in the case where the media player 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on. It is to be understood that the present invention is not limited in its application to the above-described embodiments. Needless to say, various modifications and variations of the present invention may be made without departing from the spirit and scope of the present invention.

What is claimed is:

1. In a nonvolatile storage device comprising a memory cell including first and second diffusion layers and an insulating trapping layer located close to the first and second diffusion layers and having first and second trapping regions for trapping charges therein, a first dynamic reference cell having an equivalent structure to the memory cell wherein the first trapping region of the first dynamic reference cell is set in a charge accumulated state, and a second dynamic reference cell having an equivalent structure to the memory cell wherein the first trapping region of the second dynamic reference cell is set in a charge depleted state, a method for initializing the first and second dynamic reference cells when a data storage operation stores one-bit data in accordance with the presence or absence of charges in the first trapping region of the memory cell, the method comprising the steps of:

presetting the second trapping regions of the memory cell, first and second dynamic reference cells into the charge accumulated state; and setting the first trapping region of the first dynamic reference cell into the charge accumulated state in accordance with the data storage operation of the memory cell after the presetting step.

2. The method according to claim 1, wherein the first and second dynamic reference cells are provided according to the memory cell, and wherein the setting step comprises the steps of:

in accordance with sequential selection of the memory cell during the data storing operation to the memory cell, selecting the first dynamic reference cell corresponding to the memory cell selected; and setting the first trapping region of the first dynamic reference cell selected into the charge accumulated state.

3. The method according to claim 2, wherein the first and second dynamic reference cells are provided for each sequentially selected memory cell in which the data storing operation is performed.

4. The method according to claim 3, wherein the first trapping region of each memory cell and the first trapping regions of the first and second dynamic reference cells corresponding to such memory cell are identified by the same address, and wherein the method further comprises the step of sequentially changing the address, and wherein the setting step further comprises the step of setting the first trapping region of the memory cell identified by an address targeted for charge accumulation into the charge accumulated state while setting the first trapping region of the first dynamic reference cell at each of the address targeted into the charge accumulated state.

5. The method according to claim 2, wherein the first and second dynamic reference cells corresponding to the memory cell are connected, together with the memory cell, to a common word line, and wherein the first trapping region and the second trapping region of the second dynamic reference cells connected to adjacent ones of the word lines are reversely arranged.

6. The method according to claim 5, wherein reverse addresses are assigned for identifying the first and second trapping regions of the second dynamic reference cells connected to the adjacent word lines.

7. The method according to claim 1, wherein the nonvolatile storage device further comprises a mode search cell that has an equivalent structure to the memory cell and stores a storage mode indicator having a first value or a second value, the method further comprising the steps of:

determining whether the storage mode indicator stored in the mode search cell has the first value or the second value; and selecting, in the memory cell, between a first storage mode in which the one-bit data is stored according to the presence or absence of charges in the first trapping region and a second storage mode in which two-bit data is stored according to the presence or absence of charges in each of the first and second trapping regions in response to the storage mode indicator.

8. The method according to claim 7, wherein the determining step of comprises the steps of:

determining that the storage mode indicator stored has the first value in response to the first and second trapping regions of the mode search cell being set in the charge accumulated state; and determining that the storage mode indicator stored has the second value in response to the first and second trapping regions of the mode search cell being set in the charge depleted state.

9. The method according to claim 7, wherein the mode search cell is provided in every erase unit in the nonvolatile storage device.

10. The method according to claim 7, wherein the nonvolatile storage device further comprises:
- a word line connected in common to real cells including at least one of the memory cell and the first and second dynamic reference cells; and
- a dummy cell connected to at least either end of the word line, wherein the mode search cell is connected to the word line and placed between the real cells and the dummy cell.

11. The method according to claim 1, wherein the nonvolatile storage device further comprises a blank check cell that has an equivalent structure to the memory cell wherein the presence or absence of charge in the blank check cell indicates an initialization state of the first and second dynamic reference cells.

12. The method according to claim 11, further comprising the steps of:
- setting both the first and second trapping regions of the blank check cell into the charge depleted state before the first and second dynamic reference cells are initialized; and
- setting both the first and second trapping regions of the blank check cell into the charge accumulated state after the first and second dynamic reference cells are initialized.

13. The method according to claim 11, wherein the blank check cell is provided in every program unit in the nonvolatile storage device.

14. The method according to claim 11, wherein the nonvolatile storage device further comprises a word line connected in common to real cells including at least one of the memory cell and the first and second dynamic reference cells, a dummy cell connected to at least either end of the word line, wherein the blank check cell is connected to the word line and placed between the real cells and the dummy cell.

15. A semiconductor device comprising: a memory cell including first and second diffusion layers and an insulating trapping layer located close to the first and second diffusion layers and having first and second trapping regions for trapping charges therein;
- a first dynamic reference cell having an equivalent structure to the memory cell wherein the first trapping region of the first dynamic reference cell is set in a charge accumulated state;
- a second dynamic reference cell having an equivalent structure to the memory cell wherein the first trapping region of the second dynamic reference cell is set in a charge depleted state; and
- an initializing circuit for initializing the first and second dynamic reference cells when a data storage operation stores one-bit data in accordance with the presence or absence of charges in the first trapping region of the memory cell, the initializing circuit comprising:
  - a presetting circuit for presetting the second trapping regions of the memory cell and the first and second dynamic reference cells into the charge accumulated state; and
  - a setting circuit for setting the first trapping region of the first dynamic reference cell into the charge accumulated state in accordance with the data storage operation of the memory cell after the presetting circuit has preset the second trapping regions of the memory cell and the first and second dynamic reference cells into the charge accumulated state.

16. In a nonvolatile storage device, comprising a memory cell including first and second diffusion layers and an insulating trapping layer that is located close to the first and second diffusion layers and has first and second trapping regions for trapping charges therein, a method comprising the steps of:
- prior to a data rewriting operation in the case where one-bit data is stored according to the presence or absence of charges in the first trapping region, checking a trapping state of charges with respect to the first trapping region of the memory cell;
- performing a charge accumulating operation when it is confirmed that the first trapping region is in a charge depleted state; and
- setting the first trapping regions of all the memory cells into the charge accumulated state and then performing a charge depleting operation with respect to the first and second trapping regions.

17. A wireless communications device, comprising:
a flash memory comprising:
- a memory cell including first and second diffusion layers and an insulating trapping layer located close to the first and second diffusion layers and having first and second trapping regions for trapping charges therein;
- a first dynamic reference cell having an equivalent structure to the memory cell wherein the first trapping region of the first dynamic reference cell is set in a charge accumulated state;
- a second dynamic reference cell having an equivalent structure to the memory cell wherein the first trapping region of the second dynamic reference cell is set in a charge depleted state; and
- a circuit for initializing the first and second dynamic reference cells when a data storage operation stores one-bit data in accordance with the presence or absence of charges in the first trapping region of the memory cell, the circuit comprising:
  - a presetting circuit for presetting the second trapping regions of the memory cell, first and second dynamic reference cells into the charge accumulated state; and
  - a setting circuit for setting the first trapping region of the first dynamic reference cell into the charge accumulated state in accordance with the data storage operation of the memory cell after the presetting circuit presets the second trapping regions of the memory cell, first and second dynamic reference cells into the charge accumulated state;
a communications component;
a transmitter;
a receiver; and
an antenna connected to the transmitter circuit and the receiver circuit.

18. The wireless communications device of claim 16, wherein said flash memory is NAND flash memory.

19. The wireless communications device of claim 16, wherein said flash memory is NOR flash memory.

20. The wireless communications device of claim 16, wherein said flash memory comprises at least one memory cell operable to store more than one bit.

21. A computing device comprising:
a processor;
an input component;
an output component;
a memory comprising:
- a volatile memory; and
- a flash memory comprising:

a memory cell including first and second diffusion layers and an insulating trapping layer located close to the first and second diffusion layers and having first and second trapping regions for trapping charges therein;

a first dynamic reference cell having an equivalent structure to the memory cell wherein the first trapping region of the first dynamic reference cell is set in a charge accumulated state;

a second dynamic reference cell having an equivalent structure to the memory cell wherein the first trapping region of the second dynamic reference cell is set in a charge depleted state; and a circuit for initializing the first and second dynamic reference cells when a data storage operation stores one-bit data in accordance with the presence or absence of charges in the first trapping region of the memory cell, the circuit comprising:

a presetting circuit for presetting the second trapping regions of the memory cell, first and second dynamic reference cells into the charge accumulated state; and a setting circuit for setting the first trapping region of the first dynamic reference cell into the charge accumulated state in accordance with the data storage operation of the memory cell after the presetting circuit presets the second trapping regions of the memory cell, first and second dynamic reference cells into the charge accumulated state.

22. The computing device of claim 20, wherein said computing device is a personal computer (PC).

23. The computing device of claim 20, wherein said computing device is a personal digital assistant (PDA).

24. The computing device of claim 20, wherein said computing device is a gaming system.

25. The portable media player of claim 24, wherein said portable media player is a portable music player.

26. The portable media player of claim 24, wherein said portable media player is a portable video player.

27. A portable media player comprising:

a processor;

a cache;

a user input component;

a coder-decoder component; and a memory comprising:

a flash memory comprising:

a memory cell including first and second diffusion layers and an insulating trapping layer located close to the first and second diffusion layers and having first and second trapping regions for trapping charges therein;

a first dynamic reference cell having an equivalent structure to the memory cell wherein the first trapping region of the first dynamic reference cell is set in a charge accumulated state;

a second dynamic reference cell having an equivalent structure to the memory cell wherein the first trapping region of the second dynamic reference cell is set in a charge depleted state; and a circuit for initializing the first and second dynamic reference cells when a data storage operation stores one-bit data in accordance with the presence or absence of charges in the first trapping region of the memory cell, the circuit comprising:

a presetting circuit for presetting the second trapping regions of the memory cell, first and second dynamic reference cells into the charge accumulated state; and a setting circuit for setting the first trapping region of the first dynamic reference cell into the charge accumulated state in accordance with the data storage operation of the memory cell after the presetting circuit presets the second trapping regions of the memory cell, first and second dynamic reference cells into the charge accumulated state.

\* \* \* \* \*

UNITED STATES PATENT AND TRADEMARK OFFICE
CERTIFICATE OF CORRECTION

PATENT NO.        : 7,372,743 B2
APPLICATION NO.   : 11/639128
DATED             : May 13, 2008
INVENTOR(S)       : Masaru Yano et al.

Page 1 of 1

It is certified that error appears in the above-identified patent and that said Letters Patent is hereby corrected as shown below:

On the title page, item [73] should read:

(73) Assignee:  SPANSION LLC

Signed and Sealed this

Twenty-third Day of September, 2008

JON W. DUDAS
*Director of the United States Patent and Trademark Office*